(12) United States Patent
Subhash et al.

(10) Patent No.: US 10,249,605 B2
(45) Date of Patent: Apr. 2, 2019

(54) INTEGRATED CIRCUIT DEVICES

(71) Applicant: SAMSUNG ELECTRONICS CO., LTD., Suwon-si (KR)

(72) Inventors: Kuchanuri Subhash, Hwaseong-si (KR); Rastogi Sidharth, Hwaseong-si (KR); Deepak Sharma, Suwon-si (KR); Chul-hong Park, Seongnam-si (KR); Jae-seok Yang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/655,125

(22) Filed: Jul. 20, 2017

(65) Prior Publication Data

US 2018/0158811 A1    Jun. 7, 2018

(30) Foreign Application Priority Data

Dec. 7, 2016 (KR) .................. 10-2016-0166212

(51) Int. Cl.
| | |
|---|---|
| *H01L 27/02* | (2006.01) |
| *H01L 23/528* | (2006.01) |
| *H01L 27/118* | (2006.01) |
| *H01L 27/11* | (2006.01) |
| *H01L 27/105* | (2006.01) |
| *H03K 19/00* | (2006.01) |

(52) U.S. Cl.
CPC ...... *H01L 27/0207* (2013.01); *H01L 23/5283* (2013.01); *H01L 27/105* (2013.01); *H01L 27/1116* (2013.01); *H01L 27/11807* (2013.01); *H01L 27/1104* (2013.01); *H01L 2027/11875* (2013.01); *H01L 2027/11883* (2013.01); *H03K 19/00* (2013.01)

(58) Field of Classification Search
CPC ............. H01L 27/0207; H01L 27/1116; H01L 27/105; H01L 27/11807; H01L 23/5283
See application file for complete search history.

(56) References Cited

U.S. PATENT DOCUMENTS

| | | |
|---|---|---|
| 8,987,128 B2 | 3/2015 | Rashed et al. |
| 9,213,792 B2 | 12/2015 | Becker et al. |
| 9,317,646 B2 | 4/2016 | Lu et al. |

(Continued)

FOREIGN PATENT DOCUMENTS

JP    5977806 B2    8/2016

*Primary Examiner* — Mark Prenty
(74) *Attorney, Agent, or Firm* — Sughrue Mion, PLLC

(57) ABSTRACT

An integrated circuit (IC) device includes at least one standard cell. The at least one standard cell includes: first and second active regions respectively disposed on each of two sides of a dummy region, the first and second active regions having different conductivity types and extending in a first direction; first and second gate lines extending parallel to each other in a second direction perpendicular to the first direction across the first and second active regions, a first detour interconnection structure configured to electrically connect the first gate line with the second gate line; and a second detour interconnection structure configured to electrically connect the second gate line with the first gate line. The first and second detour interconnection structures include a lower interconnection layer extending in the first direction, an upper interconnection layer extending in the second direction, and a contact via.

20 Claims, 16 Drawing Sheets

(56) References Cited

U.S. PATENT DOCUMENTS

| | | | |
|---|---|---|---|
| 9,324,715 | B2 | 4/2016 | Azmat et al. |
| 9,337,099 | B1 | 5/2016 | Jain et al. |
| 9,337,204 | B2 | 5/2016 | Calhoun et al. |
| 9,379,027 | B2 | 6/2016 | Kim |
| 9,431,300 | B1 | 8/2016 | Zeng et al. |
| 9,563,733 | B2 | 2/2017 | Becker |
| 2013/0320451 | A1 | 12/2013 | Liu et al. |
| 2018/0158811 | A1* | 6/2018 | Subhash ............ H01L 27/0207 |

\* cited by examiner

US 10,249,605 B2

INTEGRATED CIRCUIT DEVICES

CROSS-REFERENCE TO THE RELATED APPLICATION

This application claims priority from Korean Patent Application No. 10-2016-0166212, filed on Dec. 7, 2016, in the Korean Intellectual Property Office, the disclosure of which is incorporated herein in its entirety by reference.

BACKGROUND

Apparatuses and methods consistent with exemplary embodiments of the inventive concept relate to an integrated circuit (IC) device, and more particularly, to an IC device including at least one standard cell.

As electronic products tend to be lightweight, thin, and small, the demand for highly integrated semiconductor devices is on the increase. With the recent downscaling of semiconductor devices, the height of standard cells included in the IC device has been reduced. In an IC device including a cross-coupled structure, a layout capable of removing a process risk pattern without violating the design principles may be required to implement standard cells with a reduced height.

SUMMARY

Exemplary embodiments provide an integrated circuit (IC) device including at least one standard cell designed to have a reduced size.

Exemplary embodiments also provide an IC device including at least one standard cell designed to remove a process risk pattern (i.e., a pattern having a risk of changing its shape during a photolithography patterning process, such as diagonal-shaped patterns or abnormal-shaped patterns).

According to an aspect of an exemplary embodiment, there is provided an IC device including at least one standard cell. The at least one standard cell may include: first and second active regions respectively disposed on each of two sides of a dummy region, the first and second active regions having different conductivity types and extending in a first direction; first and second gate lines extending parallel to each other in a second direction perpendicular to the first direction across the first and second active regions, wherein the first gate line comprises a first portion of the first gate line and a second portion of the first gate line, and wherein the second gate line comprises a first portion of the second gate line and a second portion of the second gate line; a first detour interconnection structure configured to electrically connect the first portion of the first gate line on the first active region with the second portion of the second gate line on the second active region, and a second detour interconnection structure configured to electrically connect the first portion of the second gate line on the first active region with the second portion of the first gate line on the second active region. The first and second detour interconnection structure includes a lower interconnection layer extending in the first direction, an upper interconnection layer extending in the second direction, and a contact via on at least one of the first active region and the second active region to connect the lower interconnection layer with the upper interconnection layer.

According to an aspect of an exemplary embodiment, there is provided an IC device which may include: first and second active regions respectively disposed on each of two sides of a dummy region, the first and second active regions having different conductivity types and extending in a first direction; first and second lower gate lines extending parallel to each other on the first active region in a second direction perpendicular to the first direction; first and second upper gate lines extending on the second active region in the second direction and arranged parallel to each other, the first and second upper gate lines being disposed apart from the first and second lower gate lines, respectively; a first detour interconnection structure configured to electrically connect the first lower gate line with the second upper gate line; and a second detour interconnection structure configured to electrically connect the second lower gate line with the first upper gate line. The first and second detour interconnection structure includes a lower interconnection layer having a unidirectional structure extending in the first direction, an upper interconnection layer having a unidirectional structure extending in the second direction, and a contact via on at least one of the first active region and the second active region to connect the lower interconnection layer with the upper interconnection layer.

According to an aspect of an exemplary embodiment, an integrated circuit may include: a first active region extending in a first direction; a second active region extending in the first direction; a dummy region interposed between the first active region and the second active region, the dummy region extending in the first direction; a first gate line disposed on the first active region, the second active region, and the dummy region, and extending in a second direction perpendicular to the first direction, the first gate line including a first lower gate line and a first upper gate line; a second gate line disposed on the first active region, the second active region, and the dummy region, and extending in the second direction, the second gate line including a second lower gate line and a second upper gate line; a first detour interconnection structure; and a second detour interconnection structure. The first detour interconnection structure may include: a first lower interconnection layer electrically connected to the first lower gate line through a first gate contact; a first upper interconnection layer electrically connected to the first lower interconnection layer through a first contact via; and a second lower interconnection layer electrically connected to the first upper interconnection layer through a second contact via, the second lower interconnection layer being electrically connected to the second upper gate line through a second gate contact. The second detour interconnection structure may include: a third lower interconnection layer electrically connected to the second lower gate line through a third gate contact; a second upper interconnection layer electrically connected to the third lower interconnection layer through a third contact via; and a fourth lower interconnection layer electrically connected to the second upper interconnection layer through a fourth contact via, the fourth lower interconnection layer being electrically connected to the first upper gate line through a fourth gate contact.

BRIEF DESCRIPTION OF THE DRAWINGS

The above and/or other aspects of the exemplary embodiments will be more clearly understood from the following detailed description taken in conjunction with the accompanying drawings, in which.

DETAILED DESCRIPTION

As used herein, it will be understood that a standard cell includes a "gate line," and a semiconductor device embodied based on a standard cell includes a "gate electrode" corresponding to the gate line. Also, it will be understood that a standard cell includes a "gate cutting layer," and a semiconductor device embodied based on the standard cell has a "gate line cutting region" corresponding to the gate cutting layer.

Figure 1:
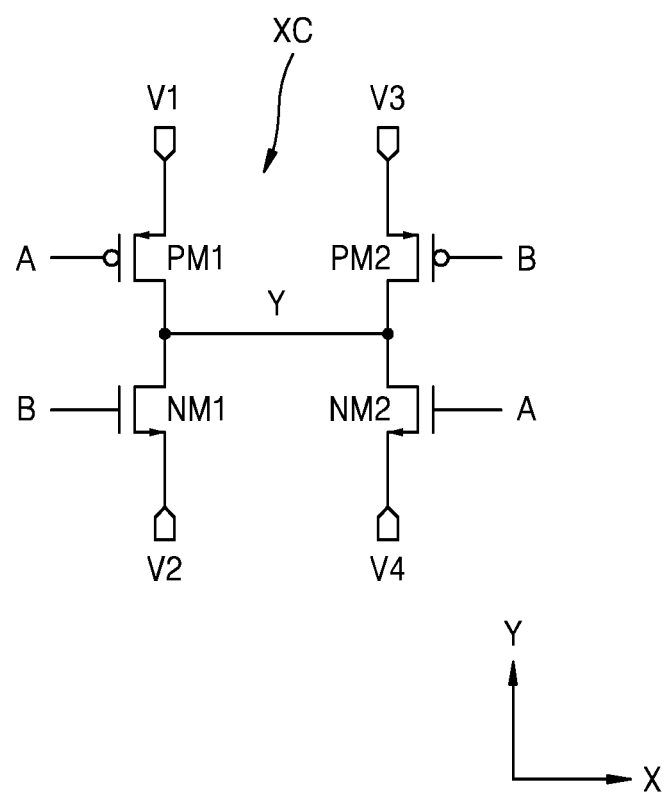
FIG. 1 is a circuit diagram of a cross-coupled structure according to an exemplary embodiment.

FIG. 1 is a circuit diagram of a cross-coupled structure XC according to an exemplary embodiment.

As shown in FIG. 1, the cross-coupled structure XC may include a first P-type metal-oxide-semiconductor (PMOS) transistor PM1 and a first N-type metal-oxide-semiconductor (NMOS) transistor NM1, which are connected in series, and a second PMOS transistor PM2 and a second NMOS transistor NM2, which are connected in series. The cross-coupled structure XC may be included in various standard cells including, for example, sequential logic cells (e.g., latches and flip-flops) or combinational logic cells (e.g., multiplexers and adders).

For example, the first PMOS transistor PM1 may have a source connected to a first voltage terminal V1, a gate to which a first control signal A is applied, and a drain connected to an output node Y. The first NMOS transistor NM1 may have a drain connected to the output node Y, a gate to which a second control signal B is applied, and a source connected to a second voltage terminal V2. The second PMOS transistor PM2 may have a source connected to a third voltage terminal V3, a gate to which the second control signal B is applied, and a drain connected to the output node Y. The second NMOS transistor NM2 may have a drain connected to the output node Y, a gate to which the first control signal A is applied, and a source connected to a fourth voltage terminal V4.

The gates of the first PMOS transistor PM1 and the second NMOS transistor NM2 may be electrically connected to each other and receive the first control signal A. Also, the gates of the first NMOS transistor NM1 and the second PMOS transistor PM2 may be electrically connected to each other and receive the second control signal B. Thus, the first and second PMOS transistors PM1 and PM2 and the first and second NMOS transistors NM1 and NM2 may constitute the cross-coupled structure XC.

Figure 2A:
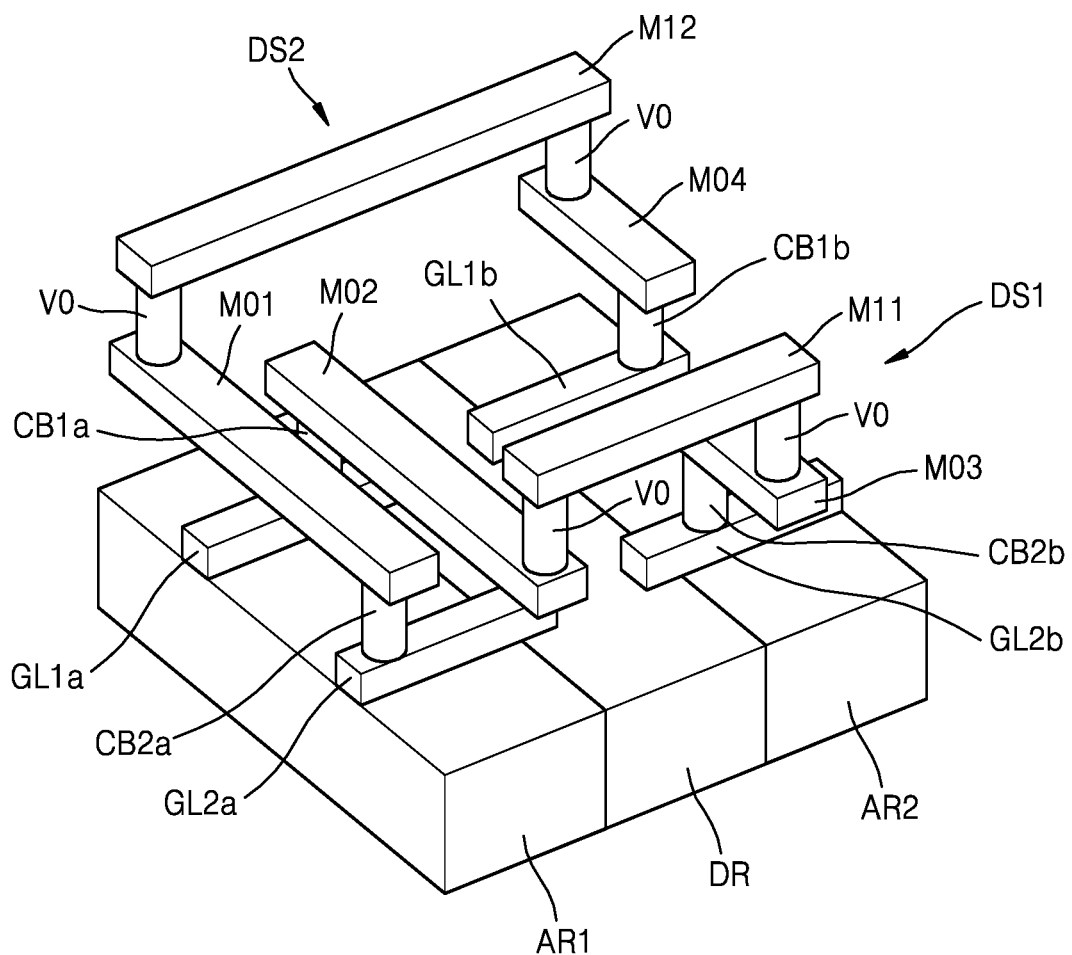
FIG. 2A is a perspective view of a portion of a standard cell corresponding to the cross-coupled structure of FIG. 1, according to an exemplary embodiment.
Figure 2B:
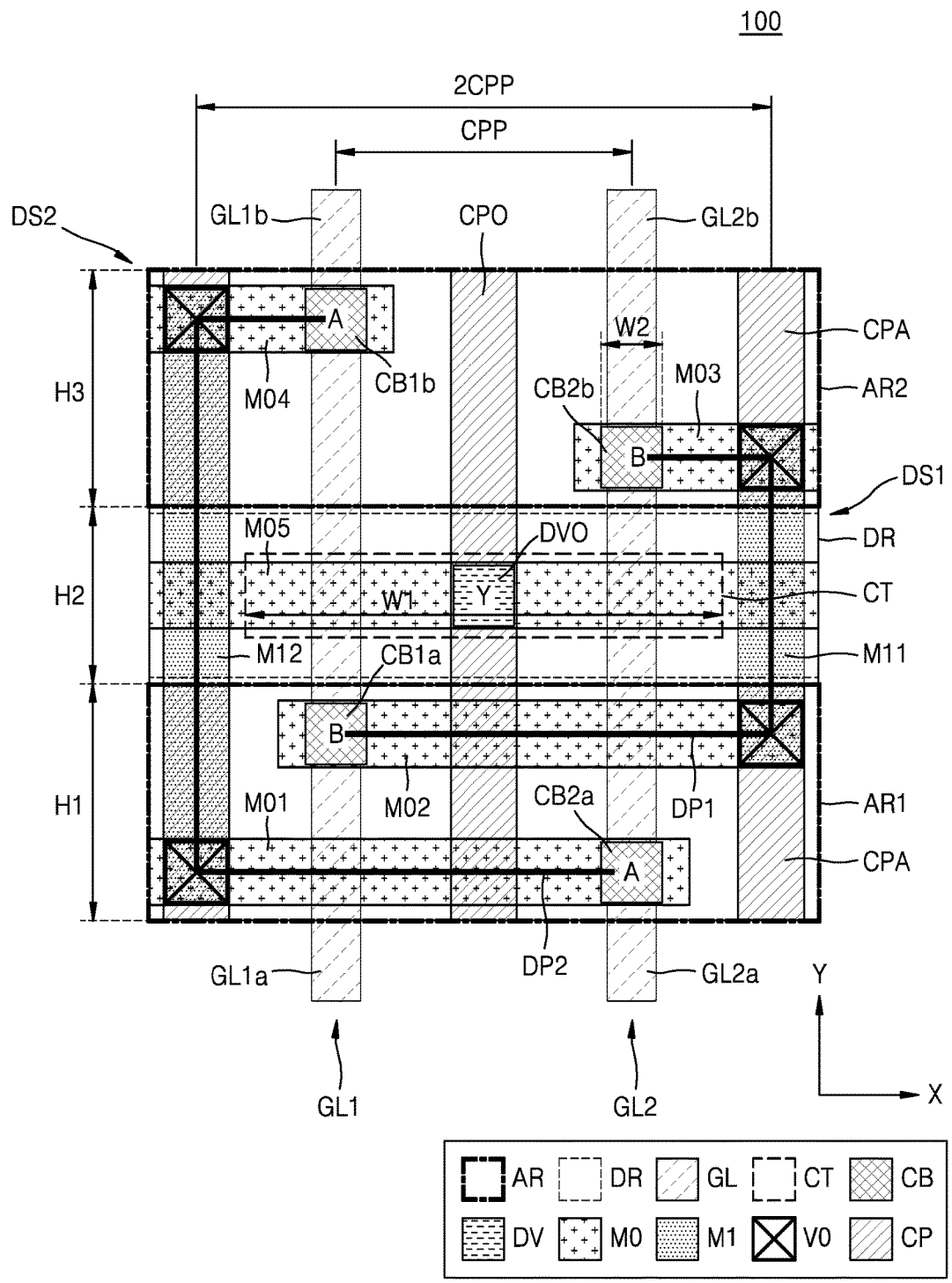
FIG. 2B illustrates the layout of the standard cell of FIG. 2A.

FIG. 2A is a perspective view of a portion of a standard cell 100 corresponding to the cross-coupled structure XC of FIG. 1, according to an exemplary embodiment. FIG. 2B illustrates the layout of the standard cell 100 of FIG. 2A. Some components of the standard cell 100 (e.g., contact pads CPA and output vias DV0 of FIG. 2B) are omitted in FIG. 2A.

As shown in FIGS. 2A and 2B, the standard cell 100 may include first and second active regions AR1 and AR2, first and second gate lines GL1 and GL2, a gate cutting layer CT, first through fourth gate contacts CB1*a*, CB1*b*, CB2*a*, and CB2*b*, and first and second detour interconnection structures DS1 and DS2.

The first and second active regions AR1 and AR2 may extend in a first direction (e.g., an X direction) and be parallel to each other in a second direction (e.g., a Y direction), which is substantially perpendicular to the first direction. The first active region AR1 and the second active region AR2 may be spaced apart from each other in the second direction and have different conductivity types. The first and second active regions AR1 and AR2 may be referred to as diffusion regions. Also, a region between the first active region AR1 and the second active region AR2 may be referred to as a dummy region DR. The first and second active regions AR1 and AR2 may respectively have first and third heights H1 and H3 in the second direction, and the dummy region DR may have a second height H2 in the second direction.

The first and second gate lines GL1 and GL2 may extend in the second direction across the first and second active regions AR1 and AR2 and be parallel to each other in the first direction. The first and second gate lines GL1 and GL2 may correspond to gate electrodes of a semiconductor device. The first and second gate lines GL1 and GL2 may be spaced a predetermined distance apart from each other. A pitch (e.g., a gate pitch) of the first and second gate lines GL1 and GL2 may be referred to as a critical poly pitch or contacted poly pitch (CPP). According to an aspect of an exemplary embodiment, a cross-coupled structure in the standard cell 100 may be designed in a region corresponding to 2CPP. Thus, the cross-coupled structure included in the standard cell 100 may be referred to as a "2CPP cross-coupled structure."

The gate cutting layer CT may be located on the dummy region DR across the first and second gate lines GL1 and GL2. Here, the gate cutting layer CT may be a marking layer for cutting portions of the first and second gate lines GL1 and GL2. Thus, each of the first and second gate lines GL1 and GL2 may be separated into two portions. Specifically, the gate cutting layer CT may run across the first gate line GL1 and separate the first gate line GL1 into a first lower gate line GL1*a* and a first upper gate line GL1*b*. Also, the gate cutting layer CT may run across the second gate line GL2 and separate the second gate line GL2 into a second lower gate line GL2a and a second upper gate line GL2b.

A first width W1, which is a size of the gate cutting layer CT in the first direction, may be 2CPP or less. Thus, the cross-coupled structure included in the standard cell 100 may be referred to as a "2CPP cross-coupled structure having a 2CPP gate cutting layer."

However, the inventive concept is not limited thereto, and the first width W1 may be an arbitrary size greater than the sum of 1CPP and a width of any one of the first and second gate lines GL1 and GL2 and less than 2CPP, so that the gate cutting layer CT may run across both of the first and second gate lines GL1 and GL2 and extend in the first direction.

The first through fourth gate contacts CB1a, CB1b, CB2a, and CB2b may be located on the first active region AR1 or the second active region AR2. For example, the first gate contact CB1a may be located on the first lower gate line GL1a located on the first active region AR1, and the second gate contact CB1b may be located on the first upper gate line GL1b located on the second active region AR2. Also, the third gate contact CB2a may be located on the second lower gate line GL2a located on the first active region AR1, and the fourth gate contact CB2b may be located on the second upper gate line GL2b located on the second active region AR2. In this case, the first through fourth gate contacts CB1a, CB1b, CB2a, and CB2b may be referred to as gate contact patterns or gate contact plugs.

The second control signal B may be applied through the first and fourth gate contacts CB1a and CB2b to the first lower gate line GL1a and the second upper gate line GL2b. The first control signal A may be applied through the second and third gate contacts CB1b and CB2a to the first upper gate line GL1b and the second lower gate line GL2a.

The first gate contact CB1a and the third gate contact CB2a may be located in a staggered form relative to each other, and the second gate contact CB1b and the fourth gate contact CB2b may be located in a staggered form relative to each other. Herein, the expression "staggered form" may indicate that two components are not located in a straight line in the first direction or the second direction, and one component is shifted in a diagonal direction to another component. For example, the first gate contact CB1a and the third gate contact CB2a may not be located in a straight line along the first direction or the second direction, and the third gate contact CB2a may be located in a diagonal direction to the first gate contact CB1a. For instance, the first gate contact CB1a and the third gate contact CB2a may be located in a zigzag formation, and the second gate contact CB1b and the fourth gate contact CB2b may be in a zigzag formation.

The first through fourth gate contacts CB1a, CB1b, CB2a, and CB2b may have island forms, which may be spaced apart from one another in the first direction or the second direction. Each of the first through fourth gate contacts CB1a, CB1b, CB2a, and CB2b may have one of various vertical sectional shapes, for example, a rectangular shape, a square shape, a circular shape, and an elliptical shape. The second width W2, which is a size of each of the first through fourth gate contacts CB1a, CB1b, CB2a, and CB2b in the first direction, may be 1CPP or less. As shown in FIG. 2B, the second width W2, which is a size of each of the first through fourth gate contacts CB1a, CB1b, CB2a, and CB2b in the first direction, may be equal to or greater than a width of each of the first and second gate lines GL1 and GL2 in the first direction. Since each of the first through fourth gate contacts CB1a, CB1b, CB2a, and CB2b has a typical sectional shape (e.g., a rectangular shape), process risk (e.g., patterning misalignment), which may occur during the formation of contact vias having an atypical sectional shape (e.g., diagonal contacts such as CBd in FIG. 5) may be markedly reduced.

The first and fourth gate contacts CB1a and CB2b may be electrically connected to each other by the first detour interconnection structure DS1, and the second and third gate contacts CB1b and CB2a may be electrically connected to each other by the second detour interconnection structure DS2. Thus, the second control signal B may be transmitted by the first detour interconnection structure DS1 to the first lower gate line GL1a and the second upper gate line GL2b. Also, the first control signal A may be transmitted by the second detour interconnection structure DS2 to the first upper gate line GL1b and the second lower gate line GL2a.

The first and second detour interconnection structures DS1 and DS2 may include a lower interconnection layer M0 having a unidirectional structure, an upper interconnection layer M1 having a unidirectional structure, and contact vias V0 configured to connect the lower interconnection layer M0 with the upper interconnection layer M1.

Herein, a "unidirectional structure" may refer to a structure in which a plurality of interconnection layers formed at the same level extend in the same direction. For example, the lower interconnection layer M0 may be formed at a higher level than top surfaces of the first and second gate lines GL1 and GL2 and extend in the first direction. The lower interconnection layer M0 may also be referred to as a metal 0 layer. The upper interconnection layer M1 may be formed at a higher level than a top surface of the lower interconnection layer M0 and extend in the second direction that is different from the first direction. Here, the first direction and the second direction may be perpendicular to each other, but the inventive concept is not limited thereto. The upper interconnection layer M1 may also be referred to as a metal 1 layer.

The lower interconnection layer M0 may include first through fifth lower interconnection layers M01, M02, M03, M04, and M05, which are formed at substantially the same level. The first and second lower interconnection layers M01 and M02 may be located over the first active region AR1, the third and fourth lower interconnection layers M03 and M04 may be located over the second active region AR2, and the fifth lower interconnection layer M05 may be located over the dummy region DR.

The upper interconnection layer M1 may include first and second upper interconnection layers M11 and M12, which are formed at substantially the same level. The upper interconnection layer M1 may be located at a higher level than the lower interconnection layer M0. Herein, an upper interconnection layer M1 located closer to the first gate line GL1 than the second gate line GL2 may be indicated by the second upper interconnection layer M12, and an upper interconnection layer M1 located closer to the second gate line GL2 than the first gate line GL1 may be indicated by the first upper interconnection layer M11. As shown in FIG. 2B, the first upper interconnection layer M11 may be located on one side of the second gate line GL2, and the second upper interconnection layer M12 may be located on one side of the first gate line GL1. However, the inventive concept is not limited thereto, and at least one of the first and second upper interconnection layers M11 and M12 may overlap one of the first and second gate lines GL1 and GL2.

The first detour interconnection structure DS1 may include the second lower interconnection layer M02, the third lower interconnection layer M03, and the first upper interconnection layer M11. Also, the first detour interconnection structure DS1 may further include contact vias V0 located between the second lower interconnection layer M02 and the first upper interconnection layer M11 and between the third lower interconnection layer M03 and the first upper interconnection layer M11. A first gate contact CB1a may be further located between the first detour interconnection structure DS1 and the first lower gate line GL1a, and a fourth gate contact CB2b may be further located between the first detour interconnection structure DS1 and the second upper gate line GL2b. That is, an electrical path DP1 may be formed from the first lower gate line GL1a through the first gate contact CB1a, the second lower interconnection layer M02, the first upper interconnection layer M11 connected by the contact via V0, the third lower interconnection layer M03 connected by the contact via V0, and the fourth gate contact CB2b to the second upper gate line GL2b, and the second control signal B may be provided to the electrical path DP1.

The second detour interconnection structure DS2 may include the first lower interconnection layer M01, the fourth lower interconnection layer M04, and the second upper interconnection layer M12. Also, the second detour interconnection structure DS2 may further include contact vias V0 located between the first lower interconnection layer M01 and the second upper interconnection layer M12 and between the fourth lower interconnection layer M04 and the second upper interconnection layer M12. A second gate contact CB1b may be further located between the second detour interconnection structure DS2 and the first upper gate line GL1b, and a third gate contact CB2a may be further located between the second detour interconnection structure DS2 and the second lower gate line GL2a. That is, an electrical path DP2 may be formed from the first upper gate line GL1b through the second gate contact CB1b, the fourth lower interconnection layer M04, the second upper interconnection layer M12 connected by the contact via V0, the first lower interconnection layer M01 connected by the contact via V0, and the third gate contact CB2a to the second lower gate line GL2a, and the first control signal A may be provided to the electrical path DP2.

Since the first gate contact CB1a and the third gate contact CB2a are located in a staggered form relative to each other, the first lower gate line GL1a and the second lower gate line GL2a may be respectively connected to the second lower interconnection layer M02 and the first lower interconnection layer M01 by the first gate contact CB1a and the third gate contact CB2a, respectively. Also, since the second gate contact CB1b and the fourth gate contact CB2b are located in a staggered form relative to each other, the first upper gate line GL1b and the second upper gate line GL2b may be respectively connected to the fourth lower interconnection layer M04 and the third lower interconnection layer M03 by the second gate contact CB1b and the fourth gate contact CB2b, respectively. Accordingly, the first and second detour interconnection structures DS1 and DS2 may be formed in a region of the standard cell 100 having a relatively small width of 2CPP. Also, the number of interconnection layers M0 and M1 (or the number of metal tracks) required to form the first and second detour interconnection structures DS1 and DS2 may also be reduced, so the height of the region of the standard cell may be reduced.

As shown in FIG. 2B, each of the contact vias V0 may be located in a position in which the lower interconnection layer M0 extending in the first direction overlaps the upper interconnection layer M1 extending in the second direction (or a position in which the lower interconnection layer M0 extending in the first direction intersects the upper interconnection layer M1 extending in the second direction on an X-Y plane). For example, each of the contact vias V0 may be of an island type. For instance, as shown in FIG. 2A, each of the contact vias V0 may have a circular horizontal cross section (e.g., cylindrical). Alternatively, as shown in FIG. 2B, each of the contact vias V0 may have a square horizontal cross section (e.g., cuboidal). The contact vias V0 may be located over the first and second active regions AR1 and AR2. Thus, the contact vias V0 may be formed in positions in which the first and second detour interconnection structures DS1 and DS2 overlap the first and second active regions AR1 and AR2 and the dummy region DR.

As shown in FIG. 2B, a common contact pad CPO may be located in a portion of the first active region AR1 between the first and second gate lines GL1 and GL2. The common contact pad CPO may extend in the second direction to a portion of the second active region AR2 between the first and second gate lines GL1 and GL2. Also, the lower interconnection layer M0 may further include the fifth lower interconnection layer M05 located on the dummy region DR. An output via DV0 may be located on the common contact pad CPO located on the dummy region DR, and the common contact pad CPO may be electrically connected to the fifth lower interconnection layer M05 by the output via DV0. Thus, the first and second active regions AR1 and AR2 may be connected to the output node Y through the common contact pad CPO and the output via DV0.

The standard cell 100 according to an aspect of an exemplary embodiment may include a relatively small number of lower interconnection layers M0 (e.g., a total of five lower interconnection layers M0) extending in the first direction, which may be formed over the first and second active regions AR1 and AR2 and the dummy region DR. In general, since the lower interconnection layers M0 having a predetermined width are repetitively arranged a predetermined distance apart from one another, reducing the number of lower interconnection layers M0 (namely, the number of tracks of the lower interconnection layers M0) included in the standard cell 100 may be advantageous in scaling a standard cell size (e.g., a standard cell height). However, in a standard cell (e.g., 100X in FIG. 5) according to a comparative example in which a diagonal contact (e.g., CBd in FIG. 5) for a cross-coupled structure is formed over a dummy region (e.g., DRX in FIG. 5), it may be necessary to increase a height (e.g., H2X or a Y-directional length of the dummy region DRX in FIG. 5), and accordingly the height of a standard cell may also increase.

However, in the standard cell 100 according to an aspect of an exemplary embodiment, a cross-coupled structure may be embodied by the first and second detour interconnection structures DS1 and DS2, which may extend from the first active region AR1 to the second active region AR2. Thus, it may be unnecessary to form the diagonal contact CBd for a cross-coupled structure in the dummy region DR. Accordingly, the second height H2 of the dummy region DR may be less than the height H2X of the dummy region DRX in the standard cell 100X of FIG. 5.

Furthermore, since the fifth lower interconnection layer M05 for the output node Y is connected to the common contact pad CPO, the lower interconnection layer M0 for the output node Y may be located over the dummy region DR. Accordingly, a 2CPP cross-coupled structure may be obtained by, for example, a total of five lower interconnection layers M0. That is, a cross-coupled structure having a reduced cell height may be embodied by the lower interconnection layers M0 having fewer tracks.

Accordingly, the cross-coupled structure may be embodied by the first and second detour interconnection structures DS1 and DS2 including the lower interconnection layer M0 and the upper interconnection layer M1, each of which has a unidirectional structure. Accordingly, it may be unnecessary to form diagonal contacts for a cross-coupled structure over the dummy region DR. Thus, process risk that may occur during the formation of the diagonal contacts may be reduced. Also, since the common contact pad CP0 and the output via DV0 are located on the dummy region DR instead of the diagonal contacts, a cell height of the dummy region DR may be reduced. As a result, a cell height of the standard cell 100 may be reduced.

Figure 3:
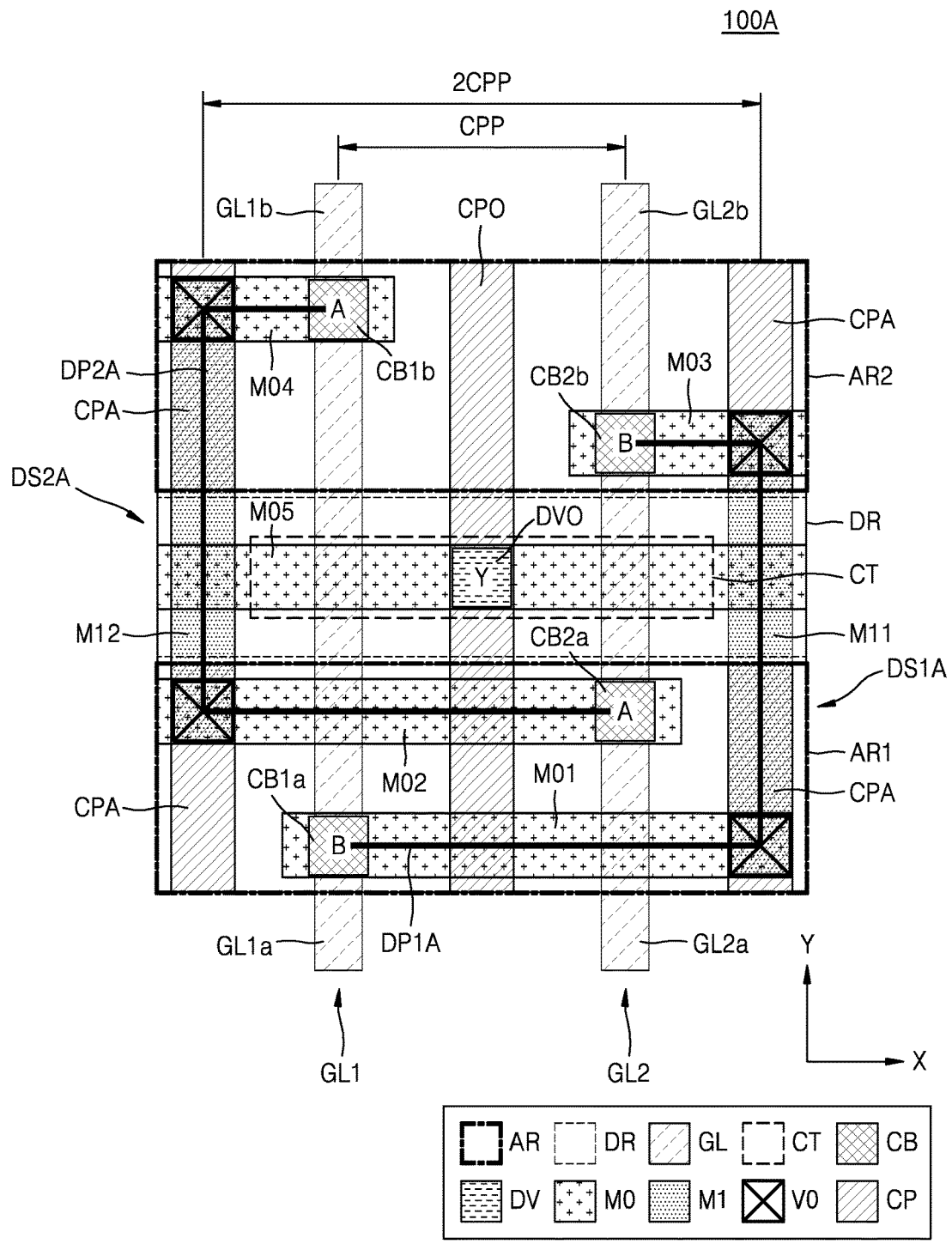
FIG. 3 illustrates the layout of a portion of a standard cell corresponding to the cross-coupled structure of FIG. 1, according to an exemplary embodiment.

FIG. 3 illustrates the layout of a portion of a standard cell 100A corresponding to the cross-coupled structure XC of FIG. 1, according to an exemplary embodiment.

As shown in FIG. 3, the first gate contact CB1a may be located on a region where the first lower interconnection layer M01 overlaps the first lower gate line GL1a (or a region where the first lower interconnection layer M01 intersects the first lower gate line GL1a on an X-Y plane), and the third gate contact CB2a may be located on a region where the second lower interconnection layer M02 overlaps the second lower gate line GL2a. Thus, a first detour interconnection structure DS1A may include the first lower interconnection layer M01, while a second detour interconnection structure DS2A may include the second lower interconnection layer M02.

Electrical paths DP1A and DP2A formed by the first detour interconnection structure DS1A and the second detour interconnection structure DS2A, respectively, may have the same length. For example, in the standard cell 100 shown in FIG. 2B, a length of the first upper interconnection layer M11 included in the electrical path DP1 that may be provided by the first detour interconnection structure DS1 may be less than a length of the second upper interconnection layer M12 included in the electrical path DP2 that may be provided by the second detour interconnection structure DS2. However, in the standard cell 100A shown in FIG. 3, a length of the first upper interconnection layer M11 included in the electrical path DP1A that may be provided by the first detour interconnection structure DS1A may be substantially equal to a length of the second upper interconnection layer M12 included in the electrical path DP2A that may be provided by the second detour interconnection structure DS2A. Thus, the electrical paths DP1A and DP2A formed by the first detour interconnection structure DS1A and the second detour interconnection structure DS2A may have substantially the same length.

Figure 4:
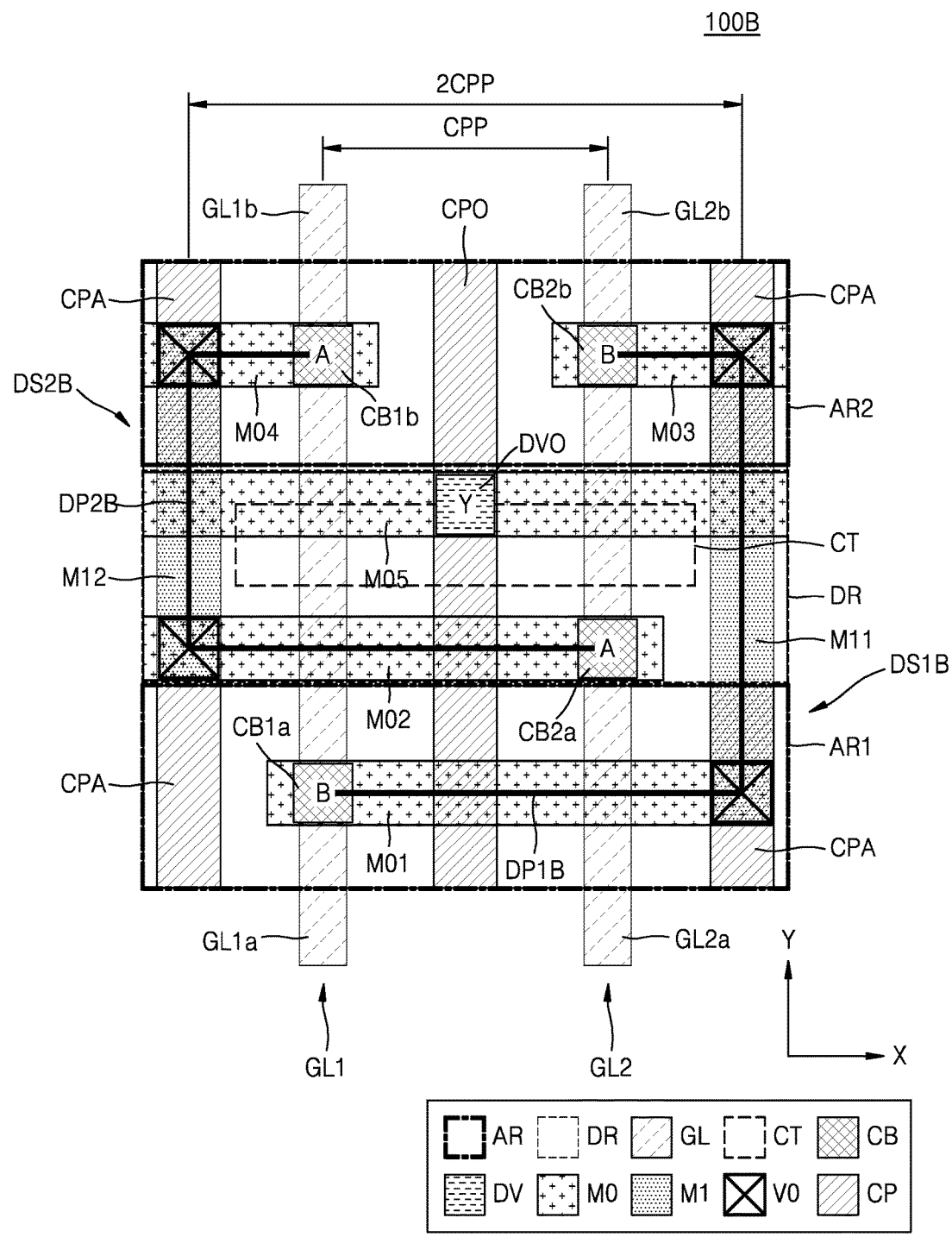
FIG. 4 illustrates the layout of a portion of a standard cell corresponding to the cross-coupled structure of FIG. 1, according to an exemplary embodiment.

FIG. 4 illustrates the layout of a portion of a standard cell 100B corresponding to the cross-coupled structure XC of FIG. 1, according to an exemplary embodiment.

As shown in FIG. 4, the standard cell 100B may include lower interconnection layers M0 extending along a total of four lines (e.g., arranged in four rows). For instance, the standard cells 100 and 100A respectively shown in FIGS. 2B and 3 may include a total of five lower interconnection layers M0, which may extend parallel to one another in the second direction (e.g., the Y direction), while the standard cell 100B shown in FIG. 4 may include a total of five interconnection layers M0, which may extend parallel to one another along a total of four lines in the second direction.

The lower interconnection layers M0 may include first through fifth lower interconnection layers M01, M02, M03, M04, and M05, and the third and fourth lower interconnection layers M03 and M04 may be located over the second active region AR2 along one straight line in the first direction. Thus, the second gate contact CB1b and the fourth gate contact CB2b, which are respectively connected to the fourth and third lower interconnection layers M04 and M03, may be located along a straight line in the first direction. As shown in FIG. 4, in the standard cell 100B, the lower interconnection layers M0 may extend along a total of four lines in a height direction. The number of lower interconnection layers M0 included in the standard cell 100B may be less than that in the standard cell 100 shown in FIG. 2B.

Alternatively, unlike what is shown in FIG. 4, the first and second lower interconnection layers M01 and M02 may be located over the first active region AR1 along a straight line (e.g., arranged in the same row) in the first direction, and the third and fourth lower interconnection layers M03 and M04 may extend parallel to each other in the first direction.

As shown in FIG. 4, the first gate contact CB1a may be located on the first lower gate line GL1a located on the first active region AR1, and the third gate contact CB2a may be located on the second lower gate line GL2a located on the dummy region DR. However, positions of the first and third gate contacts CB1a and CB2a are not limited thereto. The positions of the first and third gate contacts CB1a and CB2a may depend on a height of the first active region AR1 in the Y direction, the number of fin-type active regions formed in the first active region AR1, a height of the dummy region DR in the Y direction, and a line width (e.g., a Y-directional width) or distance between the lower interconnection layers M0. For example, unlike what is shown in FIG. 4, the first gate contact CB1a may be located on the first active region AR1, while the third gate contact CB2b may overlap both the dummy region DR and the first active region AR1 at a boundary between the dummy region DR and the first active region AR1.

In the standard cell 100B according to an aspect of an exemplary embodiment, a 2CPP cross-coupled structure may be embodied using the first and second detour interconnection structures DS1B and DS2B and the lower interconnection layers M0 with fewer tracks.

Figure 5:
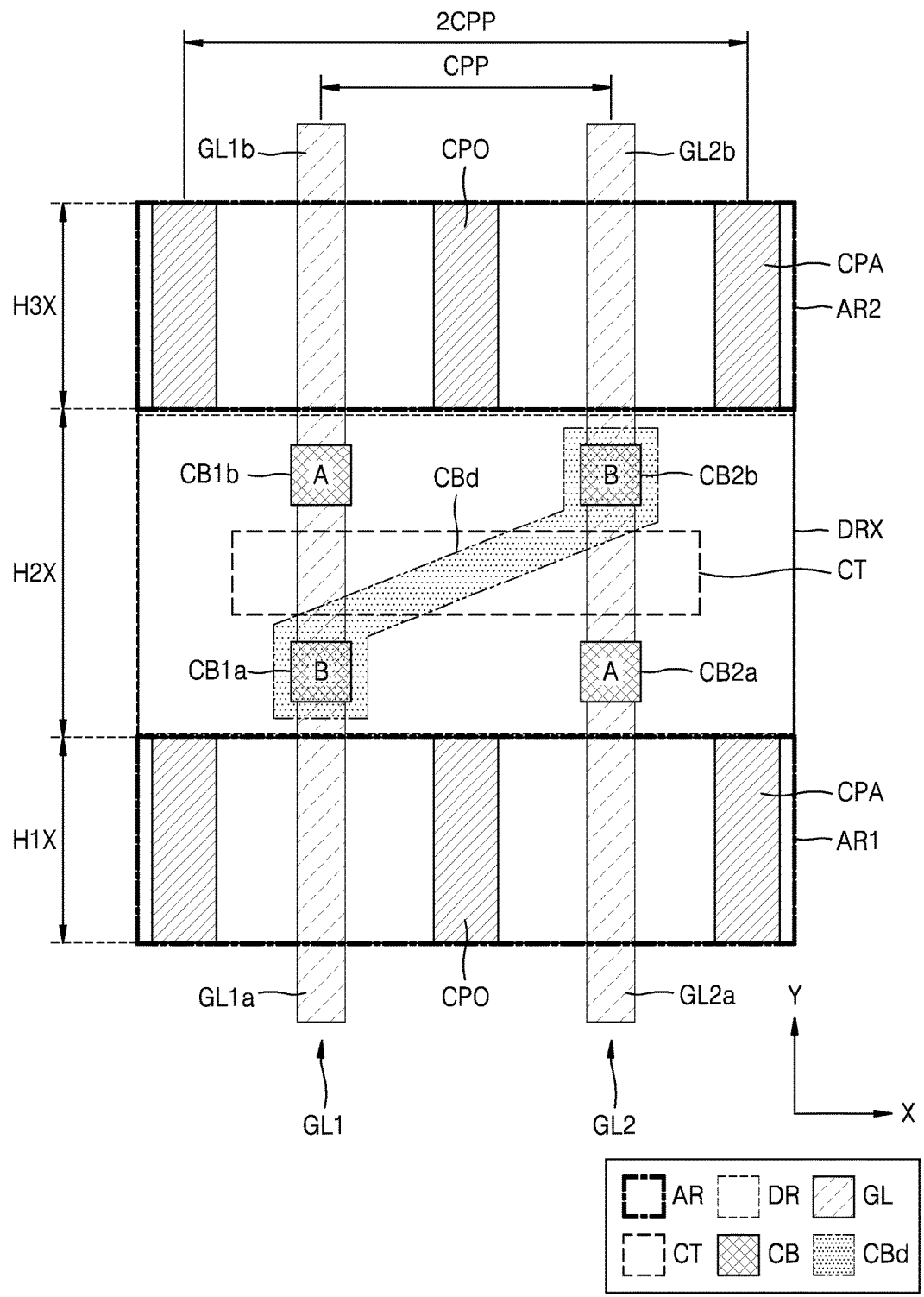
FIG. 5 illustrates the layout of a portion of a standard cell corresponding to a cross-coupled structure according to an exemplary example.

FIG. 5 illustrates the layout of a portion of a standard cell 100X corresponding to a cross-coupled structure according to a comparative example. Here, the standard cell 100X may correspond to a 2CPP cross-coupled structure including a diagonal contact CBd.

As shown in FIG. 5, the standard cell 100X may include first and second active regions AR1 and AR2, first and second gate lines GL1 and GL2, a gate cutting layer CT, gate contacts CB1a, CB1b, CB2a, and CB2b, and a diagonal contact CBd. The first and second active regions AR1 and AR2 may respectively have first and third heights H1X and H3X in a second direction (e.g., the Y direction), and a dummy region DRX may have a second height H2X in the second direction.

All of the gate contacts CB1a, CB1b, CB2a, and CB2b may be located on the dummy region DRX. A first control signal A may be applied to the gate contacts CB1b and CB2a respectively located on the first upper gate line GL1b and the second lower gate line GL2a, and a second control signal B may be applied to the gate contacts CB1a and CB2b respectively located on the first lower gate line GL1a and the second upper gate line GL2b. In this case, the gate contacts CB1a and CB2b may be electrically connected to each other by the diagonal contact CBd.

When a semiconductor device is formed based on the standard cell 100X, a warning point or a weak pattern may be caused when disconnecting the gate contacts CB1a and CB2b from the diagonal contact CBd or cutting the diagonal contact CBd. As a result, yield of semiconductor devices may be reduced.

Furthermore, in the standard cell 100X, since the gate contacts CB1a, CB1b, CB2a, and CB2b and the diagonal contact CBd are all located on the dummy region DRX, it may be necessary to increase the second height H2X (e.g., a Y-directional length) of the dummy region DRX, thus adversely affecting the scaling of a standard cell area.

Figure 6:
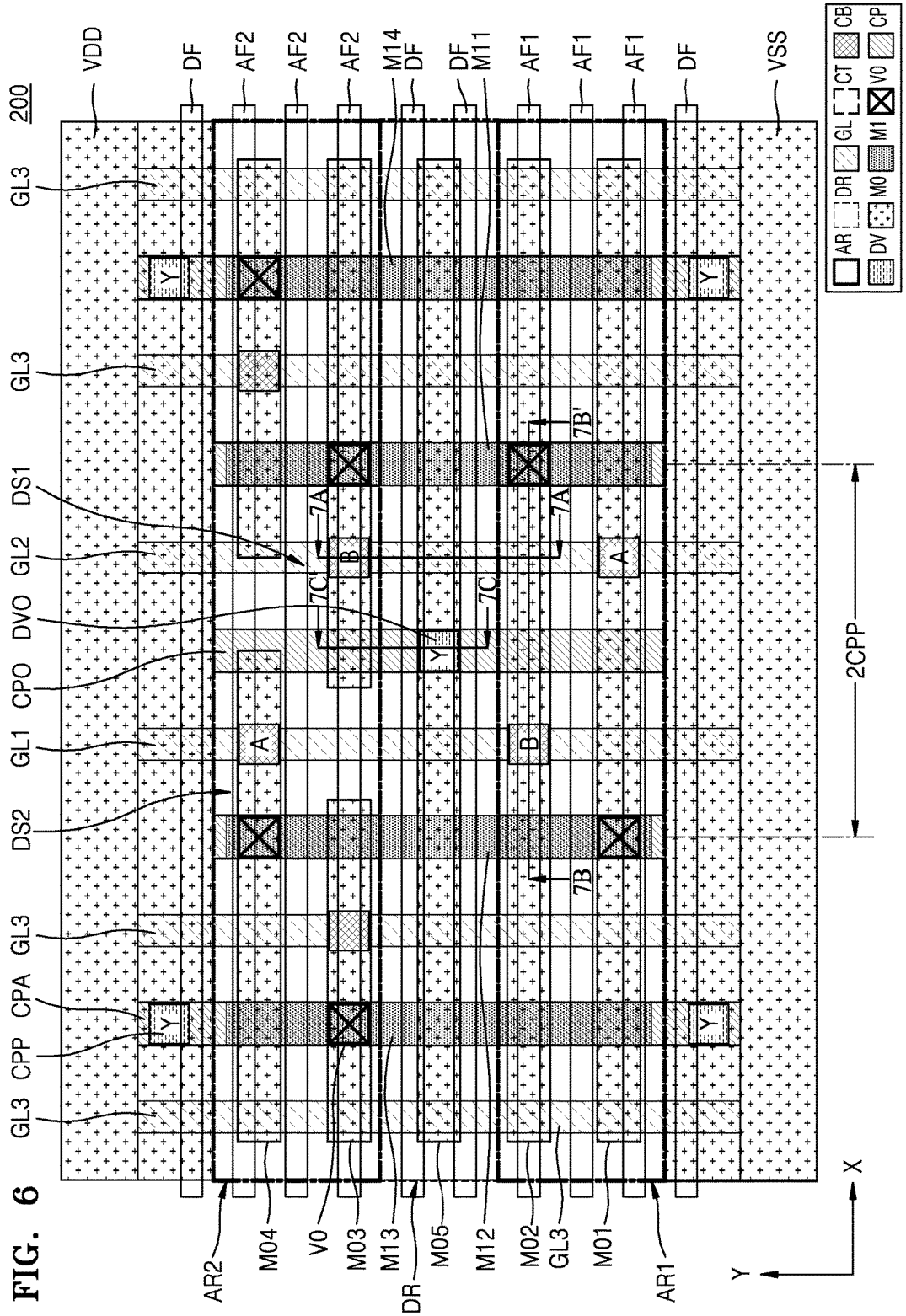
FIG. 6 illustrates the layout of a portion of a standard cell according to an exemplary embodiment.
Figure 7A:
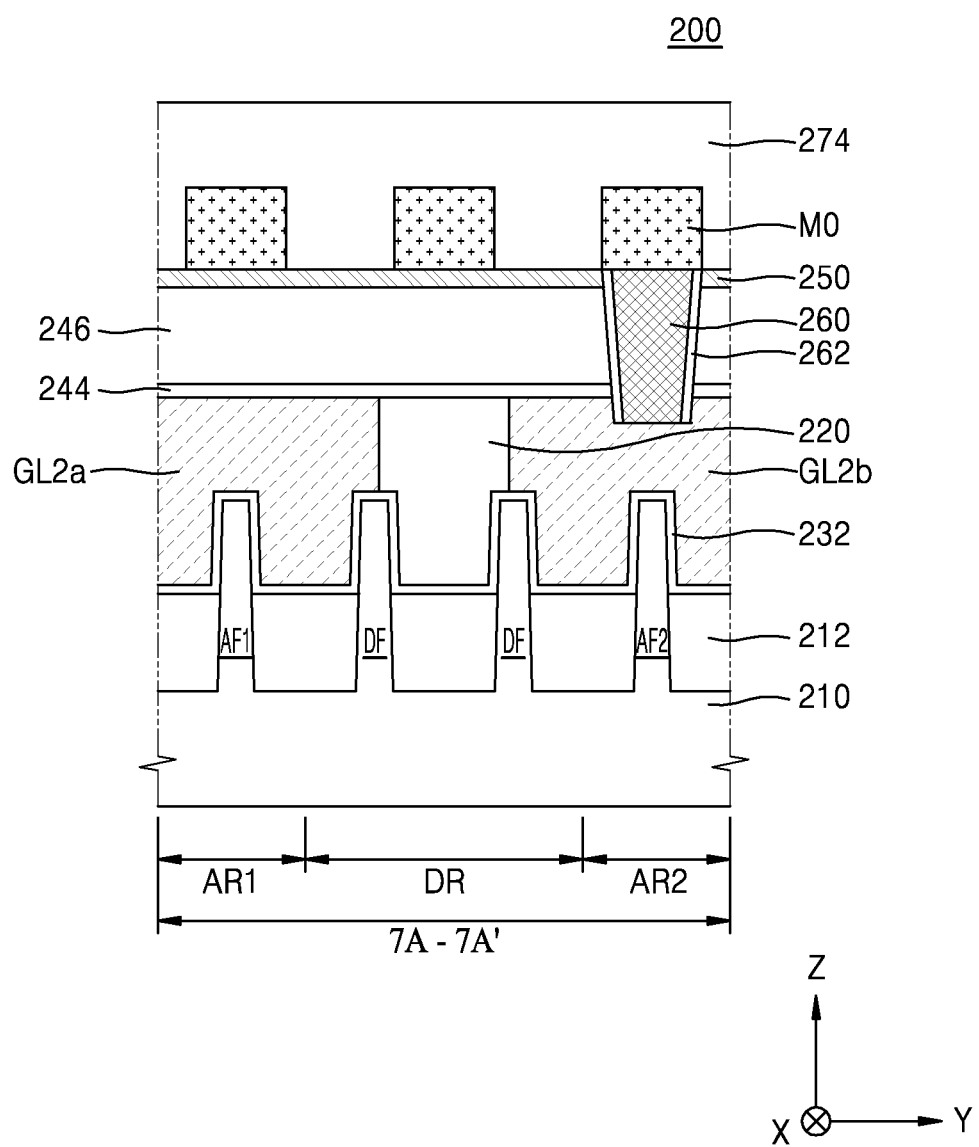
FIG. 7A is a cross-sectional view taken along a line 7A-7A' of FIG. 6.
Figure 7B:
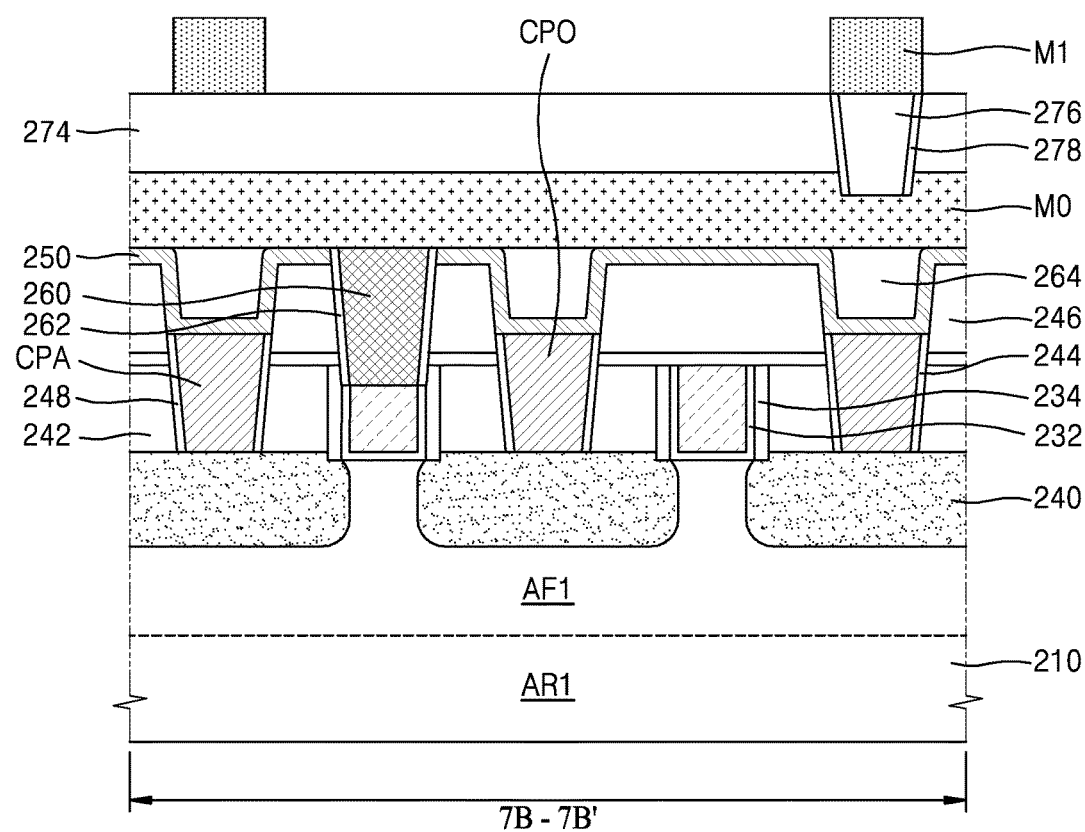
FIG. 7B is a cross-sectional view taken along a line 7B-7B' of FIG. 6.

FIG. 6 illustrates the layout of a portion of a standard cell 200 according to an exemplary embodiment. FIG. 7A is a cross-sectional view taken along a line 7A-7A' of FIG. 6, FIG. 7B is a cross-sectional view taken along a line 7B-7B' of FIG. 6, and FIG. 7C is a cross-sectional view taken along a line 7C-7C' of FIG. 6.

The standard cell 200 according to the present embodiment is an example of the standard cell 100 shown in FIGS. 2A and 2B. The descriptions of FIGS. 2A and 2B may apply to the present embodiment, and repeated descriptions will be omitted. Hereinafter, differences between the standard cell 200 according to the present embodiment and the standard cell 100 shown in FIGS. 2A and 2B will mainly be described.

Figure 7C:
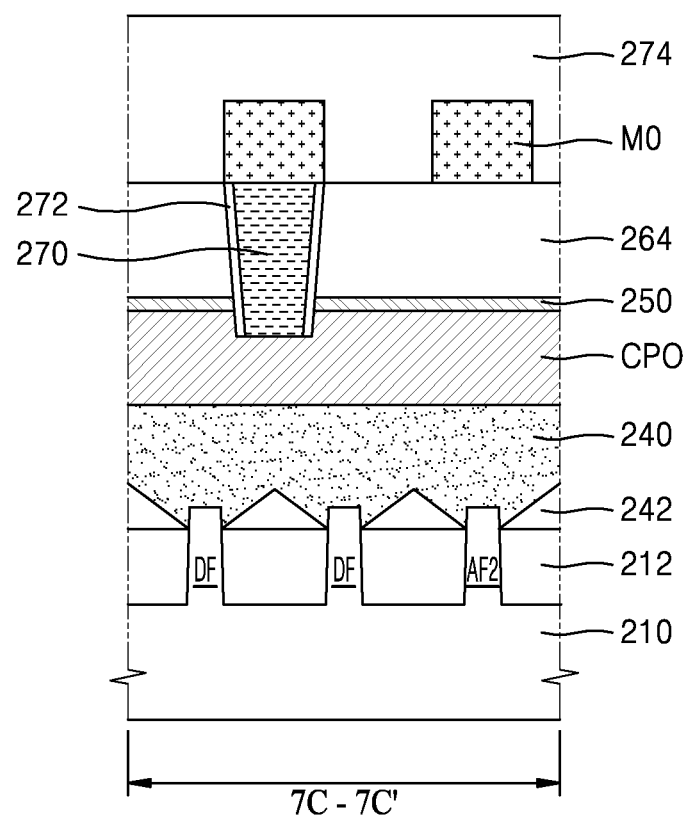
FIG. 7C is a cross-sectional view taken along a line 7C-7C' of FIG. 6.
Figure 7C:
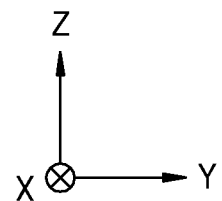

As shown in FIGS. 6 to 7C, a substrate 210 may be a semiconductor substrate. For example, the substrate 210 may include a semiconductor, such as silicon (Si) or germanium (Ge), or a compound semiconductor, such as silicon germanium (SiGe), silicon carbide (SiC), gallium arsenide (GaAs), indium arsenide (InAs), or indium phosphide (InP). The substrate 210 may include a conductive region, for example, a doped well or a doped structure.

A plurality of first and second fin-type active regions AF1 and AF2 and a plurality of dummy active regions DF may protrude from the substrate 210. For example, a plurality of first active fins AF1 may be located on the first active region AR1, and a plurality of second active fins AF2 may be located on the second active region AR2. For example, the plurality of first active fins AF1 may constitute NMOS transistors (e.g., NM1 and NM2 of FIG. 1), and the plurality of second active fins AF2 may constitute PMOS transistors (e.g., PM1 and PM2 of FIG. 1). The plurality of dummy fins DF may be located on the dummy region DR.

An isolation layer 212 may be located on the substrate 210 and cover lower sidewalls of each of the plurality of fins AF1, AF2, and DF.

The first through third gate lines GL1, GL2, and GL3 may run across the plurality of fins AF1, AF2, and DF and extend in the Y direction parallel to one another. The first through third gate lines GL1, GL2, and GL3 may extend and cover a top surface and two sidewalls of each of the plurality of fins AF1, AF2, and DF and a top surface of the isolation layer 212.

The first and second gate lines GL1 and GL2 may be gate lines included in the cross-coupled structure, and the third gate line GL3 may be a gate line provided for another component included in the standard cell 200. Each of the first and second gate lines GL1 and GL2 may be separated into two portions by a gate cutting layer CT. For example, as shown in FIG. 7A, the second gate line GL2 may be separated into the second lower gate line GL2a and the second upper gate line GL2b, and a portion of the second gate line GL2, which may overlap the gate cutting layer CT and be removed, may be filled with a buried insulating layer 220.

The gate lines GL1, GL2, and GL3 may include a work-function metal-containing layer and/or a gap-fill metal film. The work-function metal-containing layer may include at least one metal selected from the group consisting of titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). The gap-fill metal film may include a W film or an aluminum (Al) film. Each of the gate lines GL1, GL2, and GL3 may include a TiAlC/TiN/W stack structure, a TiN/TaN/TiAlC/TiN/W stack structure, or a TiN/TaN/TiN/TiAlC/TiN/W stack structure, but the inventive concept is not limited thereto. The gate lines GL1, GL2, and GL3 may be formed by using, for example, a chemical vapor deposition (CVD) process or an atomic layer deposition (ALD) process.

A gate insulating film 232 may be formed between the gate lines GL1, GL2, and GL3 and the plurality of fins AF1, AF2, and DF. The gate insulating film 232 may be a silicon oxide film, a high-k dielectric film, or a combination thereof. The high-k dielectric film may include a material having a higher dielectric constant than a silicon oxide film. For example, the gate insulating film 232 may have a dielectric constant of about 10 to about 25. The high-k dielectric film may include a metal oxide or a metal oxynitride. For example, the high-k dielectric film may include a material selected from the group consisting of hafnium oxynitride, hafnium oxynitride, hafnium silicon oxide, lanthanum oxynitride, lanthanum aluminum oxynitride, zirconium oxynitride, zirconium silicon oxide, tantalum oxynitride, titanium oxynitride, and a combination thereof, but the inventive concept is not limited thereto. In some exemplary embodiments, an interfacial layer may be interposed between the plurality of fins AF1, AF2, and DF and the gate insulating film 232. The interfacial layer may include an insulating material, such as an oxide film, a nitride film, or an oxynitride film.

Insulating spacers 234 may be located on two sidewalls of each of the gate lines GL1, GL2, and GL3. The insulating spacers 234 may include a silicon nitride film, a silicon oxycarbonitride (SiOCN) film, a silicon carbonitride (SiCN) film, or a combination thereof. In some exemplary embodiments, the insulating spacers 234 may include a material film having a lower dielectric constant than a silicon nitride film, for example, a SiOCN film, a SiCN film, or a combination thereof.

Source and drain regions 240 may be formed on two sides of each of the gate lines GL1, GL2, and GL3 on the plurality of fins AF1, AF2, and DF. The gate lines GL1, GL2, and GL3 may be spaced apart from the source and drain regions 240 with the gate insulating film 232 and the insulating spacers 234 therebetween. The source and drain regions 240 may include ion implantation regions formed in portions of the plurality of fins AF1, AF2, and DF, a semiconductor epitaxial layer epitaxially grown from a plurality of recess regions formed in the plurality of fins AF1, AF2, and DF, or a combination thereof. The source and drain regions 240 may include an epitaxially grown Si layer, an epitaxially grown SiC layer, or a plurality of epitaxially grown SiGe layers. Transistors formed on the plurality of first active fins AF1 may be NMOS transistors, and the source and drain regions 240 on two sides of the first active fins AF1 may include an epitaxially grown Si layer or an epitaxially grown SiC layer and contain N-type impurities. Also, transistors formed on the plurality of second active fins AF2 may be PMOS transistors, and the source and drain regions 240 on two sides of the second active fins AF2 may include an epitaxially grown SiGe layer and contain P-type impurities.

Partial regions of the source and drain regions 240 may be covered by an inter-gate dielectric film 242. The inter-gate dielectric film 242 may be a silicon oxide film. A first etch stop layer 244 may be formed on the gate lines GL1, GL2, and GL3 and the inter-gate dielectric film 242. The first etch stop layer 244 may include a silicon nitride film, a SiOCN film, a SiCN film, or a combination thereof. A first interlayer insulating film 246 may be formed on the first etch stop layer 244. The first interlayer insulating film 246 may include a silicon nitride film, a SiOCN film, a SiCN film, or a combination thereof. The first interlayer insulating film 246 may include a material having an etch selectivity with respect to the first etch stop layer 244.

Active contact pads CPA may be formed on the plurality of fins AF1, AF2, and DF on two sides of each of the gate lines GL1, GL2, and GL3 and connected to the source and drain regions 240. Each of the active contact pads CPA may extend in a direction (e.g., the Y direction of FIG. 1) that intersects the plurality of fins AF1, AF2, and DF. The active contact pads CPA may be surrounded with the inter-gate dielectric film 242, the first etch stop layer 244, and the first interlayer insulating film 246. A barrier film 248 may be optionally formed on sidewalls of each of the active contact pads CPA. The active contact pads CPA may include tungsten (W), cobalt (Co), nickel (Ni), tungsten silicide ($WSi_x$), cobalt silicide ($CoSi_x$), nickel silicide ($NiSi_x$), or a combination thereof, and the barrier film 248 may include titanium (Ti), tantalum (Ta), titanium nitride (TiN), tantalum nitride (TaN), or a combination thereof.

A common contact pad CP0 may be formed on the plurality of fins AF1, AF2, and DF between the first and second gate lines GL1 and GL2 and connected to the source and drain regions 240. The common contact pad CP0 may extend in the second direction and overlap all of the first active region AR1, the second active region AR2, and the dummy region DR.

An insulating liner 250 may conformally cover top surfaces of the active contact pads CPA, the common contact pad CP0, and the first interlayer insulating film 246. The insulating liner 250 may include a silicon nitride film, a SiOCN film, a SiCN film, or a combination thereof. The insulating liner 250 may include a material having an etch selectivity with respect to the first interlayer insulating film 246.

A gate contact plug 260 may be formed on the gate lines GL1, GL2, and GL3. The gate contact plug 260 may correspond to the gate contacts CB1a, CB1b, CB2a, and CB2b described with reference to FIGS. 2A and 2B. The gate contact plug 260 may be surrounded with the first etch stop layer 244, the first interlayer insulating film 246, and the insulating liner 250, and a barrier film 262 may be formed on sidewalls of the gate contact plug 260. The gate contact plug 260 may include tungsten (W) or cobalt (Co), and the barrier film 262 may include Ti, Ta, TiN, TaN, or a combination thereof.

A buried insulating layer 264 may be formed on the insulating liner 250 located on the active contact pads CPA. A top surface of the buried insulating layer 264 may be coplanar with a top surface of the gate contact plug 260. A barrier film 272 may be formed on sidewalls of an active contact plug 270. The active contact plug 270 may correspond to the output contact DV0 described with reference to FIGS. 2A and 2B. Also, the active contact plug 270 may correspond to the active contact (e.g., CPP in FIG. 6) configured to connect the active contact pad CPA with power interconnection layers VSS and VDD.

A lower interconnection layer M0 may be formed on the gate contact plug 260 and the insulating liner 250 and extend in the first direction. The lower interconnection layer M0 may include first through fifth lower interconnection layers M01, M02, M03, M04, and M05 described with reference to FIGS. 2A and 2B. The lower interconnection layer M0 may further include the power interconnection layers VSS and VDD that may extend in the first direction.

A second interlayer insulating film 274 may be formed on the insulating liner 250 and cover the lower interconnection layer M0. The second interlayer insulating film 274 may include a tetraethyl orthosilicate (TEOS) film or an ultralow-k (ULK) film having an ultra-low dielectric constant k of about 2.2 to about 2.4. The ULK film may include a SiOC film or a SiCOH film.

An upper interconnection layer M1 may be formed on the second interlayer insulating film 274 and extend in the second direction. The upper interconnection layer M1 may correspond to the first and second upper interconnection layers M11 and M12 described with reference to FIGS. 2A and 2B. A via plug 276 may penetrate the second interlayer insulating film 274 and connect the upper interconnection layer M1 with the lower interconnection layer M0. The via plug 276 may correspond to the contact via V0 described with reference to FIGS. 2A and 2B. A barrier film 278 may be formed on sidewalls of the via plug 276.

For brevity, FIGS. 7A to 7C illustrate unidirectional interconnection structures in which the lower interconnection layer M0 and the upper interconnection layer M1 extend in the first direction and the second direction, respectively. However, an additional interconnection layer may be further formed on the upper interconnection layer M1 and extend in the first direction, and the upper interconnection layer M1 may be connected to the additional interconnection layer through the contact via V0.

Figure 8:
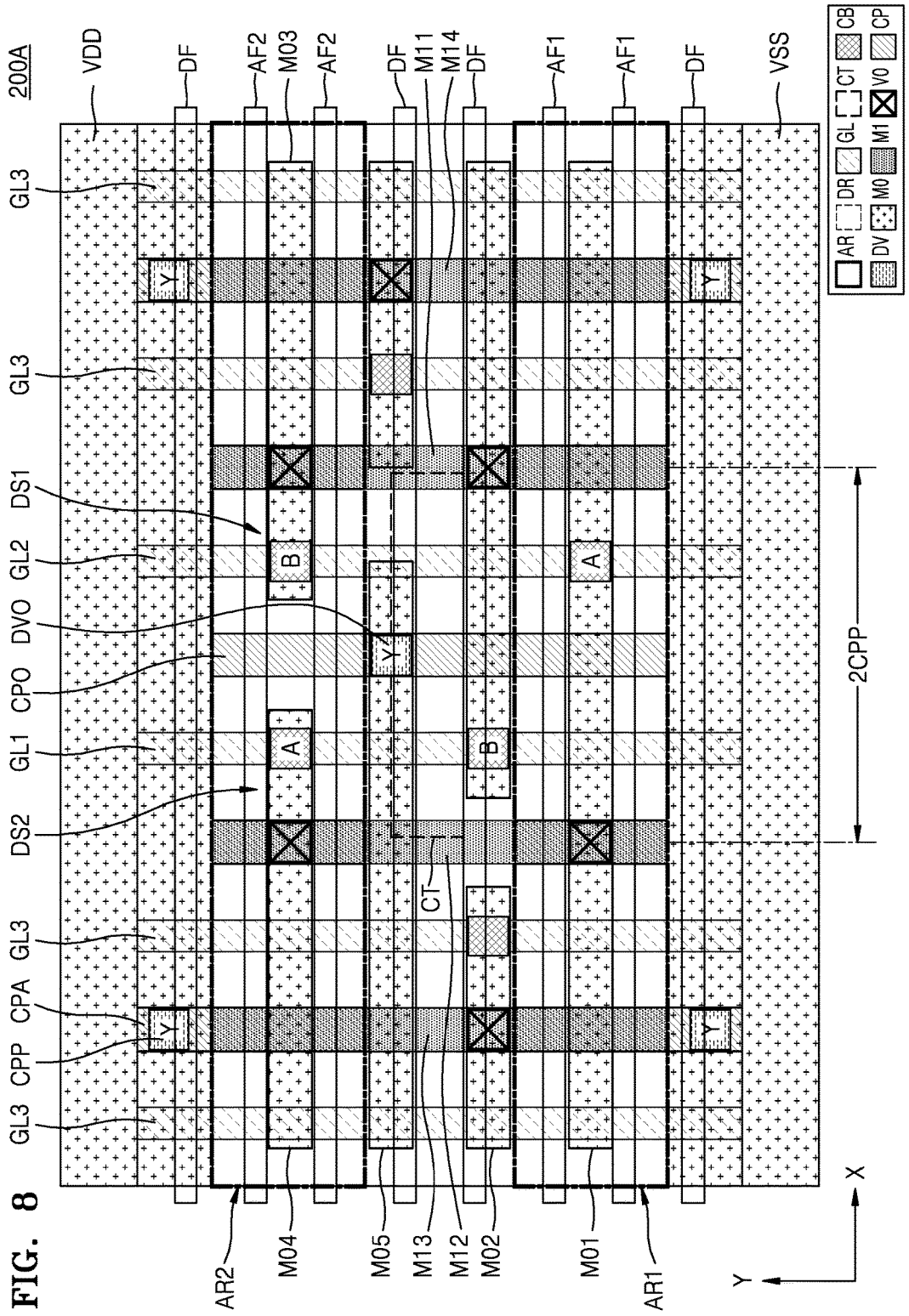
FIG. 8 illustrates the layout of a portion of a standard cell according to an exemplary embodiment.

FIG. 8 illustrates the layout of a portion of a standard cell 200A according to an exemplary embodiment. The standard cell 200A according to the present embodiment is an example of the standard cell 100B shown in FIG. 4. The descriptions of FIG. 4 may be applied to the present embodiment, and repeated descriptions will be omitted.

As shown in FIG. 8, in the standard cell 200A, two first active fins AF1 may be located on a first active region AR1, two second active fins AF2 may be located on a second active region AR2, and two dummy fins DF may be located on a dummy region DR. By comparison, in the standard cell 200 described with reference to FIG. 6, three first active fins AF1 may be located on a first active region AR1, three second active fins AF2 may be located on a second active region AR2, and three dummy fins DF may be located on a dummy region DR. For example, when the number of fins AF1, AF2, and DF included in the standard cell 200A is relatively small, the standard cell 200A may include lower interconnection layers M0, which may extend along a total of four lines (e.g., arranged in four rows), and embody a 2CPP cross-coupled structure. Accordingly, the standard cell 200A may have a compact cell area.

However, the inventive concept is not limited thereto. Even if the number of fins AF1, AF2, and DF included in the standard cell 200A is relatively large, the standard cell 200A may include a total of four lower interconnection layers M0 to ensure a relatively large distance between the lower interconnection layers M0.

Although FIG. 8 illustrates a case in which the third lower interconnection layer M03 and the fourth lower interconnection layer M04 are located in a straight line on the second active region AR2, the inventive concept is not limited thereto. In another case, the first lower interconnection layer M01 and the second lower interconnection layer M02 may be located in a straight line on the first active region AR1.

Figure 9:
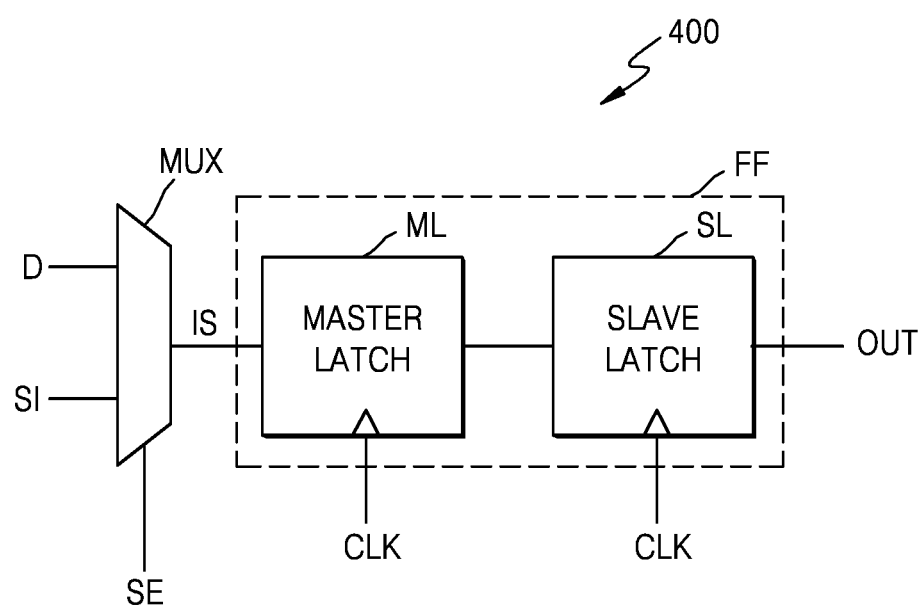
FIG. 9 is a block diagram of a scan flip-flop having a cross-coupled structure according to an exemplary embodiment.

FIG. 9 is a block diagram of a scan flip-flop 400 having a cross-coupled structure according to an exemplary embodiment.

As shown FIG. 9, the scan flip-flop 400 may include a multiplexer MUX and a flip-flop FF. The scan flip-flop 400 may include one of the cross-coupled structures described above with reference to FIGS. 1 to 8. Specifically, each of the multiplexer MUX and the flip-flop FF may include a cross-coupled structure (e.g., XC in FIG. 1). Each of the multiplexer MUX, a master latch ML and/or a slave latch SL may be embodied by the standard cell 100, 100A, 100B, 200, or 200A shown in FIG. 2A, 2B, 3, 4, 6, 7A, 7B, 7C, or 8. The scan flip-flop 400 may be embodied by a standard cell. An IC device according to an exemplary embodiment may include the standard cell that may embody the scan flip-flop 400 including the cross-coupled structure.

The multiplexer MUX may receive a data input signal D and a scan input signal SI, select one of the data input signal D and the scan input signal SI according to an operation mode, and provide the selected signal as an internal signal IS to the flip-flop FF. The multiplexer MUX may include a cross-coupled structure (e.g., XC in FIG. 1). The multiplexer MUX may select the data input signal D in a first operation mode, provide the internal signal IS to the flip-flop FF based on the data input signal D. The multiplexer MUX may select the scan input signal SI in a second operation mode and provide the internal signal IS to the flip-flop FF based on the scan input signal SI. For example, the first operation mode may be a normal operation mode in which data is transmitted, and the second operation mode may be a scan test mode in which a test operation is performed.

The flip-flop FF may latch the internal signal IS based on a clock signal CLK. The flip-flop FF may be a master-slave flip-flop including a master latch ML and a slave latch SL. The master latch ML may latch the internal signal IS based on the clock signal CLK, and the slave latch SL may latch an output of the master latch ML based on the clock signal CLK and provide an output signal OUT. The master latch ML and/or the slave latch SL may include a cross-coupled structure.

Figure 10:
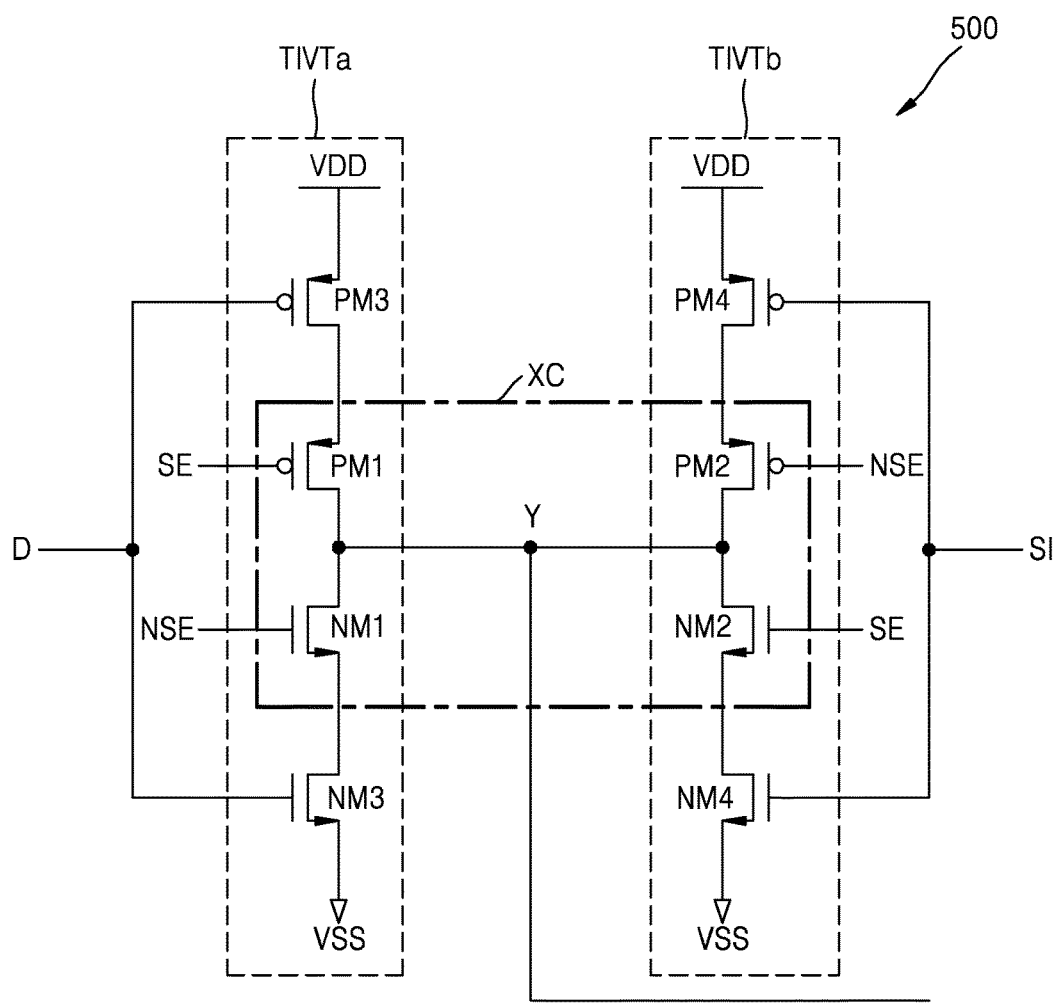
FIG. 10 is a circuit diagram of a multiplexer having a cross-coupled structure according to an exemplary embodiment.

FIG. 10 is a circuit diagram of a multiplexer 500 having a cross-coupled structure XC according to an exemplary embodiment.

As shown in FIG. 10, the multiplexer 500 may include a first tri-state inverter TIVTa and a second tri-state inverter TIVTb. The first and second tri-state inverters TIVTa and TIVTb may share the output node Y with each other and be located opposite each other. The multiplexer 500 may be embodied by a standard cell. The cross-coupled structure XC may correspond to the cross-coupled structure XC of FIG. 1.

The first tri-state inverter TIVTa may include first and third PMOS transistors PM1 and PM3 and first and third NMOS transistors NM1 and NM3. Specifically, the third PMOS transistor PM3 may include a source connected to a power supply terminal VDD and a gate to which a data input signal D is applied. The third NMOS transistor NM3 may include a source connected to a ground node VSS and a gate to which a data input signal D is applied. The first PMOS transistor PM1 may include a source connected to a drain of the third PMOS transistor PM3, a gate to which a scan enable signal SE is applied, and a drain connected to an output node Y. The first NMOS transistor NM1 may include a drain connected to the drain of the first PMOS transistor PM1 and the output node Y, a gate to which an inverted scan enable signal NSE is applied, and a source connected to the drain of the third NMOS transistor NM3.

The second tri-state inverter TIVTb may include second and fourth PMOS transistors PM2 and PM4 and second and fourth NMOS transistors NM2 and NM4. Specifically, the fourth PMOS transistor PM4 may include a source connected to the power supply terminal VDD and a gate to which a scan input signal SI is applied. The fourth NMOS transistor NM4 may include a source connected to the ground node VSS and a gate to which the scan input signal SI is applied. The second PMOS transistor PM2 may include a source connected to a drain of the fourth PMOS transistor PM4, a gate to which the inverted scan enable signal NSE is applied, and a drain connected to the output node Y. The second NMOS transistor NM2 may include a drain connected to the drain of the second PMOS transistor PM2 and the output node Y, a gate to which the scan enable signal SE is applied, and a source connected to the drain of the fourth NMOS transistor NM4.

Thus, the scan enable signal SE may be applied to the gates of the first PMOS transistor PM1 and the second NMOS transistor NM2, and the inverted scan enable signal NSE may be applied to the gates of the first NMOS transistor NM1 and the second PMOS transistor PM2. Accordingly, the first and second PMOS transistors PM1 and PM2 and the first and second NMOS transistors NM1 and NM2 may constitute the cross-coupled structure XC. The cross-coupled structure XC may be embodied by the standard cell 100, 100A, 100B, 200, or 200A shown in FIG. 2A, 2B, 3, 4, 6, 7A, 7B, 7C, or 8.

Figure 11:
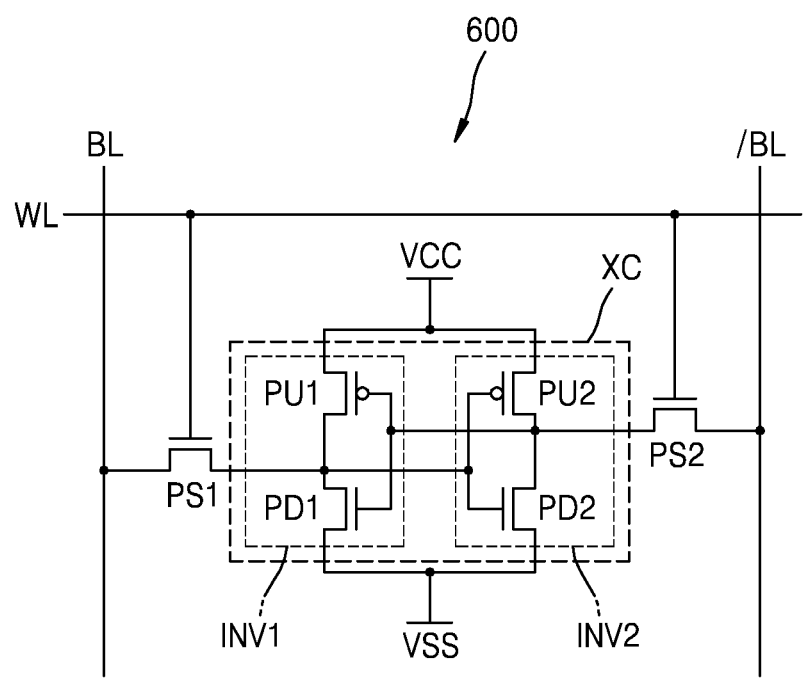
FIG. 11 is a circuit diagram of a memory cell having a cross-coupled structure according to an exemplary embodiment.

FIG. 11 is a circuit diagram of a memory cell 600 having a cross-coupled structure XC according to an exemplary embodiment.

As shown in FIG. 11, the memory cell 600 may include a pair of inverters INV1 and INV2 connected in parallel between a power supply terminal VCC and a ground node VSS, and first and second pass transistors PS1 and PS2 connected to respective output nodes of the inverters INV1 and INV2. The pair of inverters INV1 and INV2 may constitute a cross-coupled structure XC, which may correspond to the cross-coupled structure XC of FIG. 1. The first pass transistor PS1 and the second pass transistor PS2 may be connected to a bit line BL and a complementary bit line /BL, respectively. Gates of the first pass transistor PS1 and the second pass transistor PS2 may be connected to a word line WL.

The first inverter INV1 may include a first pull-up transistor PU1 and a first pull-down transistor PD1, which are connected in series, while the second inverter INV2 may include a second pull-up transistor PU2 and a second pull-down transistor PD2, which are connected in series. The first pull-up transistor PU1 and the second pull-up transistor PU2 may be PMOS transistors, while the first pull-down transistor PD1 and the second pull-down transistor PD2 may be NMOS transistors. Also, an input node of the first inverter INV1 may be connected to the output node of the second inverter INV2 and an input node of the second inverter INV2 may be connected to the output node of the first inverter INV1 so that the first inverter INV1 and the second inverter INV2 may constitute one latch circuit. The cross-coupled structure XC may be embodied by the standard cell 100, 100A, 100B, 200, or 200A shown in FIG. 2A, 2B, 3, 4, 6, 7A, 7B, 7C, or 8.

Figure 12:
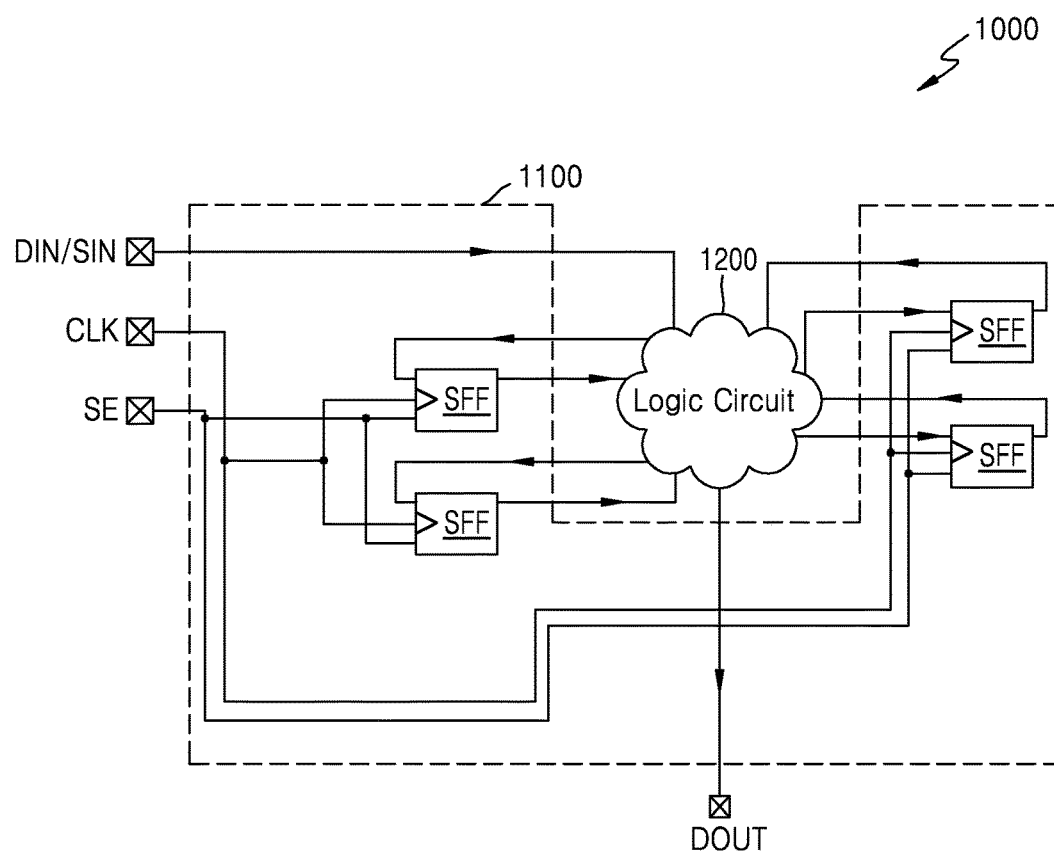
FIG. 12 is a block diagram of a data processing device including a scan flip-flop having a cross-coupled structure according to an exemplary embodiment.

FIG. 12 is a block diagram of a data processing device 1000 including a scan flip-flop having a cross-coupled structure according to an exemplary embodiment.

As shown in FIG. 12, the data processing device 1000 may include a scan flip-flop group 1100 and a logic circuit 1200. The data processing device 1000 may be embodied by an integrated circuit (IC), a system on chip (SoC), a central processing unit (CPU), or a processor.

The scan flip-flop group 1100 may include a plurality of scan flip-flops SFF, each of which may be embodied by the scan flip-flop 400 shown in FIG. 9. Each of the scan flip-flops SFF may include a cross-coupled structure according to an exemplary embodiment. Specifically, each of the scan flip-flops SFF may be embodied by the standard cell 100, 100A, 100B, 200, or 200A shown in FIG. 2A, 2B, 3, 4, 6, 7A to 7C, or 8. Each of the scan flip-flops SFF may perform data communications with the logic circuit 1200 in response to a clock signal CLK. The logic circuit 1200 may be embodied by a synchronous circuit or an asynchronous circuit. The logic circuit 1200 may process input data DIN or scan data SIN and generate output data DOUT corresponding to the processing result.

Figure 13:
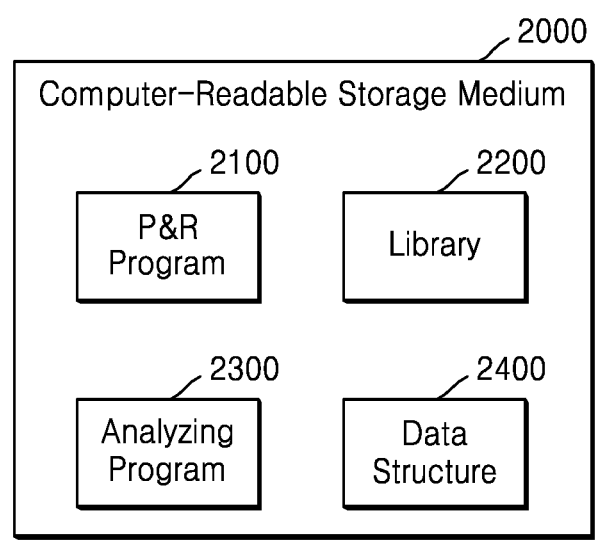
FIG. 13 is a block diagram of a computer-readable storage medium according to an exemplary embodiment.

FIG. 13 is a block diagram of a computer-readable storage medium 2000 according to an exemplary embodiment.

As shown in FIG. 13, the computer-readable storage medium 2000 may include a storage medium that may be read by a computer while being used to provide commands and/or data to the computer. For example, the computer-readable storage medium 2000 may include a magnetic or optical medium, such as a disk, a tape, Compact Disc Read-Only Memory (CD-ROM), digital versatile disc read-only memory (DVD-ROM), Compact Disc-Recordable (CD-R), Compact Disc-ReWritable (CD-RW), DVD recordable (DVD-R), and DVD rewritable (DVD-RW).

As shown in FIG. 13, the computer-readable storage medium 2000 may include a volatile or non-volatile memory, such as random access memory (RAM), ROM, flash memory, a non-volatile memory that is accessible via a universal serial bus (USB) interface, and microelectromechanical systems (MEMS). The computer-readable storage medium 2000 may be inserted into a computer, integrated with the computer, or combined with the computer via a communication medium, such as a network and/or a wireless link.

As shown in FIG. 13, the computer-readable storage medium 2000 may include a placing & routing (P&R) program 2100, a library 2200, an analyzing program 2300, and a data structure 2400. The P&R program 2100 may include a plurality of commands to perform a method of designing an IC by using a standard cell library including information of standard cells having a cross-coupled structure. For example, the computer-readable storage medium 2000 may store the P&R program 2100 including some commands for designing an IC by using a standard cell library including standard cells shown in at least one of the drawings. The library 2200 may include information of standard cells that are units of an IC.

The analyzing program 2300 may include a plurality of commands to perform a method of analyzing an IC based on data that defines the IC. The data structure 2400 may include a storage space for managing data stored during a process of using the standard cell library included in the library 2200, a process of extracting specific information from a typical standard cell library included in the library 2200, or a process of analyzing characteristics of an IC by using the analyzing program 2300.

While the inventive concept has been particularly shown and described, it will be understood that various changes in form and details may be made therein without departing from the spirit and scope of the following claims.

What is claimed is:

1. An integrated circuit device comprising at least one standard cell, wherein the at least one standard cell comprises:
a first active region and a second active region respectively disposed on each of two sides of a dummy region, the first and second active regions having different conductivity types and extending in a first direction;
a first gate line and a second gate line extending parallel to each other in a second direction perpendicular to the first direction across the first active region and the second active region, wherein the first gate line comprises a first portion of the first gate line and a second portion of the first gate line, and the second gate line comprises a first portion of the second gate line and a second portion of the second gate line;
a first detour interconnection structure configured to electrically connect the first portion of the first gate line on the first active region with the second portion of the second gate line on the second active region; and
a second detour interconnection structure configured to electrically connect the first portion of the second gate line on the first active region with the second portion of the first gate line on the second active region,
wherein the first and second detour interconnection structures comprise a lower interconnection layer extending in the first direction, an upper interconnection layer extending in the second direction, and a contact via on at least one of the first active region and the second active region to connect the lower interconnection layer with the upper interconnection layer.

2. The integrated circuit device of claim 1, wherein the first detour interconnection structure overlaps the first active region, the second active region, and the dummy region, and wherein the second detour interconnection structure overlaps the first active region, the second active region, and the dummy region and is spaced apart from the first detour interconnection structure.

3. The integrated circuit device of claim 1, further comprising:
a first gate contact disposed on the first portion of the first gate line on the first active region;
a second gate contact disposed on the second portion of the first gate line on the second active region;
a third gate contact disposed on the first portion of the second gate line on the first active region; and
a fourth gate contact disposed on the second portion of the second gate line on the second active region,
wherein the first and third gate contacts are in a staggered form relative to each other, or the second and fourth gate contacts are in a staggered form relative to each other.

4. The integrated circuit device of claim 3, wherein the first gate contact, the second gate contact, the third gate contact, and the fourth gate contact have a width that is less than or equal to a pitch of the first gate line and the second gate line.

5. The integrated circuit device of claim 1, further comprising a gate cutting layer on the dummy region across the first gate line and the second gate line, the gate cutting layer configured to separate the first gate line into the first portion of the first gate line and the second portion of the first gate line, and separate the second gate line into the first portion of the second gate line and the second portion of the second gate line.

6. The integrated circuit device of claim 5, wherein a width of the gate cutting layer in the first direction is less than or equal to twice a pitch of the first gate line and the second gate line.

7. The integrated circuit device of claim 5, wherein the lower interconnection layer comprises first through fourth lower interconnection layers, and
wherein one of the first and second lower interconnection layers is connected to the first portion of the first gate line, and another one of the first and second lower interconnection layers is connected to the first portion of the second gate line.

8. The integrated circuit device of claim 7, wherein one of the third and fourth lower interconnection layers is connected to the second portion of the first gate line, and another one of the third and fourth lower interconnection layers is connected to the second portion of the second gate line.

9. The integrated circuit device of claim 7, wherein the first and second lower interconnection layers are on the first active region, and
wherein the third and fourth lower interconnection layers are on the second active region.

10. The integrated circuit device of claim 7, wherein at least a portion of any one of the second and third lower interconnection layers overlaps the dummy region.

11. The integrated circuit device of claim 1, further comprising a common contact pad extending from a portion of the first active region between the first gate line and the second gate line to a portion of the second active region between the first gate line and the second gate line.

12. The integrated circuit device of claim 11, further comprising an output via on the common contact pad located on the dummy region,
wherein the lower interconnection layer further comprises a fifth lower interconnection layer connected to the output via, and
wherein the fifth lower interconnection layer extends on the dummy region in the first direction.

13. An integrated circuit device comprising:
a first active region and a second active region respectively disposed on each of two sides of a dummy region, the first active region and the second active region having different conductivity types and extending in a first direction;
a first portion of a first gate line and a first portion of a second gate line extending parallel to each other on the first active region in a second direction perpendicular to the first direction;
a second portion of the first gate line and a second portion of the second gate line extending on the second active region in the second direction and arranged parallel to each other, the second portion of the first gate line and the second portion of the second gate line being disposed apart from the first portion of the first gate line and the first portion of the second gate line, respectively;
a first detour interconnection structure configured to electrically connect the first portion of the first gate line with the second portion of the second gate line; and
a second detour interconnection structure configured to electrically connect the first portion of the second gate line with the second portion of the first gate line,
wherein the first and second detour interconnection structures comprise a lower interconnection layer having a unidirectional structure extending in the first direction, an upper interconnection layer having a unidirectional structure extending in the second direction, and a contact via on at least one of the first active region and the second active region to connect the lower interconnection layer with the upper interconnection layer.

14. The integrated circuit device of claim 13, further comprising:
a first gate contact disposed on the first portion of the first gate line;
a second gate contact disposed on the second portion of the first gate line;
a third gate contact disposed on the first portion of the second gate line; and
a fourth gate contact disposed on the second portion of the second gate line,
wherein the first and third gate contacts are in a staggered form relative to each other, or the second and fourth gate contacts are in a staggered form relative to each other.

15. The integrated circuit device of claim 14, wherein one of the first and third gate contacts is connected to the first detour interconnection structure, and another one of the first and third gate contacts is connected to the second detour interconnection structure.

16. The integrated circuit device of claim 14, wherein one of the second and fourth gate contacts is connected to the first detour interconnection structure, and another one of the second and fourth gate contacts is connected to the second detour interconnection structure.

17. The integrated circuit device of claim 14, wherein the first gate contact, the second gate contact, the third gate contact, and the fourth gate contact have a width in the first direction that is less than or equal to a pitch of the second portion of the first gate line and the second portion of the second gate line.

18. The integrated circuit device of claim 14, wherein the lower interconnection layer comprises first and second lower interconnection layers on the first active region and third and fourth lower interconnection layers on the second active region, and
wherein one of the first and second lower interconnection layers is connected to the first detour interconnection structure, and another one of the first and second lower interconnection layers is connected to the second detour interconnection structure.

19. The integrated circuit device of claim 13, further comprising a common contact pad extending from a portion of the first active region between the first portion of the first gate line and the first portion of the second gate line to a portion of the second active region between the second portion of the first gate line and the second portion of the second gate line, wherein the common contact pad overlaps the dummy region.

20. An integrated circuit comprising:
a first active region extending in a first direction;
a second active region extending in the first direction;
a dummy region interposed between the first active region and the second active region, the dummy region extending in the first direction;
a first gate line disposed on the first active region, the second active region, and the dummy region, and extending in a second direction perpendicular to the first direction, the first gate line comprising a first portion of the first gate line and a second portion of the first gate line;
a second gate line disposed on the first active region, the second active region, and the dummy region, and extending in the second direction, the second gate line comprising a first portion of the second gate line and a second portion of the second gate line;
a first detour interconnection structure comprising:

a first lower interconnection layer electrically connected to the first portion of the first gate line through a first gate contact;

a first upper interconnection layer electrically connected to the first lower interconnection layer through a first contact via; and a second lower interconnection layer electrically connected to the first upper interconnection layer through a second contact via, the second lower interconnection layer being electrically connected to the second portion of the second gate line through a second gate contact; and a second detour interconnection structure comprising:

a third lower interconnection layer electrically connected to the first portion of the second gate line through a third gate contact;

a second upper interconnection layer electrically connected to the third lower interconnection layer through a third contact via; and a fourth lower interconnection layer electrically connected to the second upper interconnection layer through a fourth contact via, the fourth lower interconnection layer being electrically connected to the second portion of the first gate line through a fourth gate contact.

* * * * *